United States Patent
Abraham et al.

(10) Patent No.: US 11,821,068 B2
(45) Date of Patent: *Nov. 21, 2023

(54) MAGNETICALLY ENHANCED HIGH DENSITY PLASMA-CHEMICAL VAPOR DEPOSITION PLASMA SOURCE FOR DEPOSITING DIAMOND AND DIAMOND-LIKE FILMS

(71) Applicant: IonQuest Corp., Milford, MA (US)

(72) Inventors: Bassam Hanna Abraham, Millis, MA (US); Roman Chistyakov, North Andover, MA (US)

(73) Assignee: IonQuest Corp., Milford, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/690,107

(22) Filed: Mar. 9, 2022

(65) Prior Publication Data
US 2022/0195585 A1   Jun. 23, 2022

Related U.S. Application Data

(63) Continuation of application No. 17/124,749, filed on Dec. 17, 2020, now Pat. No. 11,306,391, which is a
(Continued)

(51) Int. Cl.
*H01J 37/34* (2006.01)
*C23C 14/35* (2006.01)
(Continued)

(52) U.S. Cl.
CPC ........ *C23C 14/354* (2013.01); *C23C 14/0057* (2013.01); *C23C 14/0605* (2013.01);
(Continued)

(58) Field of Classification Search
CPC .............. C23C 14/354; C23C 14/0057; C23C 14/0605; C23C 14/14; C23C 14/345;
(Continued)

(56) References Cited

U.S. PATENT DOCUMENTS 3,767,551 A   10/1973 Lang, Jr. et al.
4,060,470 A   11/1977 Clarke
(Continued)

FOREIGN PATENT DOCUMENTS

WO   2014/053209 A1   4/2014
WO   2016/028640 A1   2/2016
(Continued)

OTHER PUBLICATIONS

Non-Final Office Action received for U.S. Appl. No. 17/127,527 dated Aug. 30, 2022, 45 pages.
(Continued)

*Primary Examiner* — Rodney G McDonald
(74) *Attorney, Agent, or Firm* — FISHERBROYLES, LLP

(57) ABSTRACT

A magnetically enhanced plasma apparatus includes a hollow cathode target assembly; an anode positioned on top of the hollow cathode target assembly, thereby forming a gap between the anode and the hollow cathode target assembly; a cathode magnet assembly; a row of magnets that generate a magnetic field in the gap and a magnetic field on a surface of the hollow cathode target assembly with the cathode magnet assembly such that magnetic field lines are substantially perpendicular to a surface of the hollow cathode target assembly; an electrode positioned adjacent to the row of magnets behind the gap; a first radio frequency (RF) power supply coupled to the electrode, wherein the electrode is coupled to ground through an inductor; and a second radio frequency (RF) power supply coupled to the hollow cathode target assembly. The second RF power supply ignites and sustains plasma in the hollow cathode target assembly. A frequency and power of the second RF power supply are selected to increase at least one of a degree of dissociation of feed gas molecules and degree of ionization of feed gas
(Continued)

atoms. A frequency and power of the first RF power supply are selected to increase a degree of dissociation of feed gas molecules to form a layer from sputtering hollow cathode target material onto a substrate.

20 Claims, 16 Drawing Sheets

Related U.S. Application Data continuation of application No. 16/261,516, filed on Jan. 29, 2019, now Pat. No. 10,900,118, which is a continuation of application No. 15/261,197, filed on Sep. 9, 2016, now Pat. No. 10,227,691.

(60) Provisional application No. 62/270,356, filed on Dec. 21, 2015.

(51) Int. Cl.
| | |
|---|---|
| *C23C 14/34* | (2006.01) |
| *C23C 16/505* | (2006.01) |
| *H01L 21/285* | (2006.01) |
| *H01L 21/768* | (2006.01) |
| *H01L 23/522* | (2006.01) |
| *H01L 23/532* | (2006.01) |
| *H01J 37/32* | (2006.01) |
| *C23C 14/00* | (2006.01) |
| *C23C 14/06* | (2006.01) |
| *C23C 14/14* | (2006.01) |

(52) U.S. Cl.
CPC ............ *C23C 14/14* (2013.01); *C23C 14/345* (2013.01); *C23C 14/3485* (2013.01); *C23C 14/35* (2013.01); *C23C 16/505* (2013.01); *H01J 37/321* (2013.01); *H01J 37/32825* (2013.01); *H01J 37/345* (2013.01); *H01J 37/3405* (2013.01); *H01J 37/3417* (2013.01); *H01J 37/3426* (2013.01); *H01J 37/3435* (2013.01); *H01J 37/3452* (2013.01); *H01J 37/3455* (2013.01); *H01J 37/3464* (2013.01); *H01J 37/3467* (2013.01); *H01L 21/2855* (2013.01); *H01L 21/76843* (2013.01); *H01L 21/76871* (2013.01); *H01L 21/76879* (2013.01); *H01L 21/76882* (2013.01); *H01L 23/5226* (2013.01); *H01L 23/53238* (2013.01)

(58) Field of Classification Search
CPC ................ C23C 14/3485; C23C 14/35; C23C 16/505; H01J 37/321; H01J 37/32825; H01J 37/3405; H01J 37/3417; H01J 37/3426; H01J 37/3435
USPC .......................... 204/298.08, 298.06, 192.12
See application file for complete search history.

(56) References Cited

U.S. PATENT DOCUMENTS

| | | | |
|---|---|---|---|
| 4,588,490 A | 5/1986 | Cuomo et al. | |
| 5,178,739 A | 1/1993 | Barnes et al. | |
| 5,227,211 A | 7/1993 | Eltoukhy et al. | |
| 5,482,611 A | 1/1996 | Helmer et al. | |
| 5,651,865 A | 7/1997 | Sellers | |
| 6,024,843 A | 2/2000 | Anderson et al. | |
| 6,077,403 A | 6/2000 | Kobayashi et al. | |
| 6,216,632 B1 | 4/2001 | Wickramanayaka | |
| 6,903,511 B2 | 6/2005 | Chistyakov | |
| 7,095,179 B2 | 8/2006 | Chistyakov | |
| 7,179,350 B2 | 2/2007 | Laptev et al. | |
| 7,327,089 B2 | 2/2008 | Madocks | |
| 7,898,183 B2 | 3/2011 | Chistyakov et al. | |
| 8,535,494 B2* | 9/2013 | Ohmi ................. | H01J 37/3497 204/298.11 |
| 8,696,875 B2 | 4/2014 | Ding et al. | |
| 9,267,200 B2 | 2/2016 | Krassnitzer et al. | |
| 9,624,571 B2 | 4/2017 | Arndt et al. | |
| 9,771,647 B1 | 9/2017 | Scobey et al. | |
| 9,951,414 B2 | 4/2018 | Chistyakov et al. | |
| 10,227,691 B2 | 3/2019 | Abraham et al. | |
| 10,227,692 B2 | 3/2019 | Chistyakov et al. | |
| 10,480,063 B2 | 11/2019 | Chistyakov et al. | |
| 10,913,998 B2 | 2/2021 | Chistyakov et al. | |
| 10,957,519 B2 | 3/2021 | Chistyakov et al. | |
| 11,359,274 B2 | 6/2022 | Abraham et al. | |
| 11,482,404 B2 | 10/2022 | Abraham et al. | |
| 2001/0050220 A1 | 12/2001 | Chiang et al. | |
| 2004/0089541 A1 | 5/2004 | Matsumoto et al. | |
| 2004/0095497 A1 | 5/2004 | Compton et al. | |
| 2004/0227470 A1 | 11/2004 | Benveniste et al. | |
| 2006/0066248 A1 | 3/2006 | Chistyakov | |
| 2006/0278521 A1 | 12/2006 | Stowell | |
| 2006/0290399 A1 | 12/2006 | MacDougall et al. | |
| 2008/0190760 A1 | 8/2008 | Tang et al. | |
| 2009/0321249 A1 | 12/2009 | Chistyakov et al. | |
| 2011/0011737 A1 | 1/2011 | Wu et al. | |
| 2014/0041800 A1 | 2/2014 | Okuyama et al. | |
| 2014/0305795 A1 | 10/2014 | Bardos et al. | |
| 2015/0348773 A1 | 12/2015 | Zhu et al. | |
| 2016/0215386 A1 | 7/2016 | Stowell | |
| 2017/0178878 A1 | 6/2017 | Abraham et al. | |
| 2017/0178912 A1 | 6/2017 | Chistyakov et al. | |
| 2018/0374688 A1 | 12/2018 | Chistyakov et al. | |
| 2018/0374689 A1 | 12/2018 | Abraham et al. | |
| 2019/0249293 A1 | 8/2019 | Abraham et al. | |
| 2019/0256969 A1 | 8/2019 | Chistyakov et al. | |
| 2019/0271070 A1 | 9/2019 | Abraham et al. | |
| 2019/0316249 A1 | 10/2019 | Abraham et al. | |
| 2020/0176234 A1 | 6/2020 | Abraham et al. | |
| 2021/0102284 A1 | 4/2021 | Abraham et al. | |
| 2021/0115552 A1 | 4/2021 | Abraham et al. | |
| 2021/0115553 A1 | 4/2021 | Abraham | |
| 2021/0317569 A1 | 10/2021 | Abraham | |

FOREIGN PATENT DOCUMENTS

| | | |
|---|---|---|
| WO | 2017/112696 A1 | 6/2017 |
| WO | 2017/112700 A1 | 6/2017 |
| WO | 2018/186901 A1 | 10/2018 |

OTHER PUBLICATIONS

Non-Final Office Action received for U.S. Appl. No. 17/352,168 dated Aug. 30, 2022, 39 pages.
Non-Final Office Action received for U.S. Appl. No. 16/261,514 dated Jun. 29, 2020, 26 pages.
Notice of Allowance received for U.S. Appl. No. 16/261,514 dated Oct. 9, 2020, 81 pages.
Non-Final Office Action received for U.S. Appl. No. 15/260,857 dated Mar. 9, 2018, 40 pages.
Final Office Action received for U.S. Appl. No. 15/260,857 dated Nov. 19, 2018, 16 pages.
Non-Final Office Action received for U.S. Appl. No. 15/260,841 dated Jan. 9, 2019, 8 pages.
Notice of Allowance received for U.S. Appl. No. 15/260,841 dated May 28, 2019, 16 pages.
Helmersson et al., "Ionized physical vapor deposition (IPVD): A review of technology and applications", URL: http:// run.kb.se/ resolve?um=um:nbn:se:liu:diva-10434, Postprint available: Linkoping University E-Press, Article in Thin SolidFilms, Aug. 14, 2006, 61 pages.
International Search Report and Written Opinion received for PCT Application Serial No. PCT/US2017/048438 dated Nov. 3, 2017, 10 pages.
Non-Final Office Action received for U.S. Appl. No. 15/261,119 dated Jun. 26, 2017, 14 pages.

(56) References Cited

OTHER PUBLICATIONS

Non-Final Office Action received for U.S. Appl. No. 15/261,197 dated Jun. 18, 2018, 14 pages.
Notice of Allowance received for U.S. Appl. No. 15/261,197 dated Oct. 31, 2018, 18 pages.
International Search Report and Written Opinion received for PCT Application Serial No. PCT/US2016/067850 dated Mar. 9, 2017, 7 pages.
International Preliminary Report on Patentability received for PCT Application Serial No. PCT/US2016/067850 dated Jul. 5, 2018, 7 pages.
Wang et al., "Hollow cathode magnetron", Journal of Vacuum Science & Technology A, vol. 17, No. 1, 1999, pp. 77-82.
International Search Report and Written Opinion received for PCT Application Serial No. PCT/US2016/067838 dated Mar. 16, 2017, 7 pages.
International Preliminary Report on Patentability received for PCT Application Serial No. PCT/US2016/067838 dated Jul. 5, 2018, 6 pages.
Abraham et al., "Electrically and Magnetically Enhanced Ionized Physical Vapor Deposition Unbalanced Sputtering Source", U.S. Appl. No. 16/284,327 dated Feb. 25, 2019, 114 pages.
Abraham et al., "Electrically and Magnetically Enhanced Ionized Physical Vapor Deposition Unbalanced Sputtering Source", U.S. Appl. No. 16/400,539 dated May 1, 2019, 64 pages.
Abraham et al., "Magnetically Enhanced Low Temperature-High Density Plasma-Chemical Vapor Deposition Plasma Source for Depositing Diamond and Diamond Like Films", U.S. Appl. No. 16/261,516 dated Jan. 29, 2019, 60 pages.
Abraham et al., "High-Power Resonance Pulse Ac Hedp Sputtering Source and Method for Material Processing", U.S. Appl. No. 16/025,928 dated Jul. 2, 2018, 76 pages.
Non-Final Office Action received for U.S. Appl. No. 16/063,283 dated Sep. 22, 2020, 35 pages.
Non-Final Office Action received for U.S. Appl. No. 16/025,928 dated Sep. 25, 2020, 24 pages.
Chistyakov et al., "Magnetically Enhanced High Density Plasma-Chemical Vapor Deposition Plasma Source for Depositing Diamond and Diamond-Like Films", U.S. Appl. No. 16/261,514 dated Jan. 29, 2019, 62 pages.
Non-Final Rejection received for U.S. Appl. No. 16/063,284 dated Jan. 30, 2020, 26 pages.
Non-Final Rejection received for U.S. Appl. No. 16/063,284 dated May 20, 2020, 12 pages.
Notice of Allowance received for U.S. Appl. No. 16/063,284 dated Dec. 17, 2020, 36 pages.
Non-Final Rejection received for U.S. Appl. No. 16/261,516 dated Jun. 29, 2020, 28 pages.
Notice of Allowance received for U.S. Appl. No. 16/261,516 dated Oct. 19, 2020, 24 pages.
International Preliminary Report on Patentability received for PCT Application Serial No. PCT/US2017/048438 dated Oct. 17, 2019, 8 pages.
Abraham et al., "Magnetically Enhanced High Density Plasma-Chemical Vapor Deposition Plasma Source for Depositing Diamond and Diamond-Like Films", U.S. Appl. No. 17/124,691, filed Dec. 17, 2020, 63 pages.
Abraham et al., "Magnetically Enhanced High Density Plasma-Chemical Vapor Deposition Plasma Source for Depositing Diamond and Diamond-Like Films", U.S. Appl. No. 17/124,749, filed Dec. 17, 2020, 62 pages.
Final Office Action received for U.S. Appl. No. 16/063,283 dated Mar. 18, 2021, 32 pages.
Abraham, Bassam Hanna, "Magnetically Enhanced High Density Plasma-Chemical Vapor Deposition Plasma Source for Depositing Diamond and Diamond-Like Films", U.S. Appl. No. 17/127,527, filed Dec. 18, 2020, 172 pages.
Abraham, Bassam Hanna, "Magnetically Enhanced High Density Plasma-Chemical Vapor Deposition Plasma Source for Depositing Diamond and Diamond-Like Films", U.S. Appl. No. 17/352,168, filed Jun. 18, 2021, 172 pages.
Non-Final Office Action received for U.S. Appl. No. 16/063,283 dated Aug. 19, 2021, 21 pages.
Non-Final Office Action received for U.S. Appl. No. 16/400,539 dated Sep. 23, 2021, 38 pages.
Non-Final Office Action received for U.S. Appl. No. 16/284,327 dated Sep. 15, 2021, 42 pages.
Non-Final Office Action received for U.S. Appl. No. 17/124,691 dated Nov. 1, 2021, 42 pages.
Notice of Allowance received for U.S. Appl. No. 16/400,539 dated Oct. 8, 2021, 13 pages.
Non-Final Office Action received for U.S. Appl. No. 17/124,749 dated Nov. 5, 2021, 44 pages.
Notice of Allowance received for U.S. Appl. No. 17/124,749 dated Dec. 21, 2021, 26 pages.
Non-Final Office Action received for U.S. Appl. No. 17/946, 139, dated Jul. 27, 2023, 14 pages.

\* cited by examiner

MAGNETICALLY ENHANCED HIGH DENSITY PLASMA-CHEMICAL VAPOR DEPOSITION PLASMA SOURCE FOR DEPOSITING DIAMOND AND DIAMOND-LIKE FILMS

CROSS-REFERENCE TO RELATED APPLICATIONS

This application is a continuation of U.S. application Ser. No. 17/124,749, filed Dec. 17, 2020, which is a continuation of U.S. application Ser. No. 16/261,516, filed Jan. 29, 2019, which is a continuation application of U.S. application Ser. No. 15/261,197, filed Sep. 9, 2016, which claims the benefit of U.S. Provisional Application No. 62/270,356, filed Dec. 21, 2015, the disclosures of which are incorporated by reference herein in their entireties. U.S. application Ser. No. 15/260,841 entitled "Capacitive Coupled Plasma Source for Sputtering and Resputtering", U.S. application Ser. No. 15/260,857 entitled "Electrically and Magnetically Enhanced Ionized Physical Vapor Deposition Unbalanced Sputtering Source", and U.S. application Ser. No. 15/261,119 entitled "Magnetically Enhanced High Density Plasma-Chemical Vapor Deposition Plasma Source for Depositing Diamond and Diamond-Like Films" are incorporated by reference herein in their entireties.

BACKGROUND

Field

The disclosed embodiments generally relate to a plasma enhanced-chemical vapor deposition (PE CVD) apparatus and method and, more particularly, relate to a pulse magnetically enhanced low temperature-high density plasma-chemical vapor deposition (LT-HDP-CVD deposition) apparatus and method.

Related Art

Two CVD plasma sources for depositing diamond like coatings and diamond films include hot filament chemical vapor deposition (HFCVD) and microwave assisted CVD. Both methods require a high temperature on the substrate to form a carbon film with a high content of sp3 bonds. Thus, it would be advantageous to develop new LT-HDP-CVD technology that would allow the deposition of diamond and DLC films at a much low temperature.

SUMMARY

Various embodiments relate to an apparatus, method, and system for a pulse magnetically enhanced low temperature-high density plasma-chemical vapor deposition (LT-HDP-CVD) deposition of thin and thick film coatings, particularly diamond and diamond like coatings. The thickness of diamond and diamond like coatings can be in a range of 10 Å to 100 μm.

The magnetically enhanced LT-HDP-CVD source includes (a) a hollow cathode connected to a power supply, which can be a pulsed power supply, variable power direct current (DC) power supply, radio frequency (RF) power supply, pulsed RF power supply, and/or high power impulse magnetron sputtering (HIPIMS) power supply, (b) an anode that is connected to ground, (c) a gap between a hollow cathode and an anode, (d) a row of permanent magnets or electromagnets that are positioned adjacent to the gap in order to form a magnetic field in the gap, (e) a cathode magnet assembly configured to generates magnetic field lines substantially perpendicular to a surface of the hollow cathode, (f) a magnetic coupling between the cathode magnet assembly and a magnetic field in the gap, and (g) a flowing liquid that cools and controls the temperature of the hollow cathode.

The magnetically enhanced LT-HDP-CVD source may include (a) a pole piece positioned adjacent to the magnets forming the magnetic field in the gap and exposed to the plasma through the gap, (b) a gas distribution system, (c) an inductor connected between the hollow cathode and ground, (d) a motor that rotates the cathode magnet assembly, (e) a voltage power supply connected with the pole piece, (f) an inductor connected between the pole piece and ground, (g) a RF power and/or pulse power supply connected to the pole piece, and (h) a RF power and/or pulse power supply connected to the hollow cathode.

The magnetically enhanced LT-HDP-CVD apparatus includes (a) a magnetically enhanced LT-HDP-CVD source, (b) a vacuum chamber, (c) a substrate holder, (d) a substrate, (e) a feed gas mass flow controller, and (f) a vacuum pump.

The magnetically enhanced LT-HDP-CVD apparatus may include (a) a direct current (DC) or radio frequency (RF) substrate bias power supply, (b) a substrate heater, (c) a plurality of magnetically enhanced LT-HDP-CVD sources, (d) a gas activation source, (a) an additional magnet assembly positioned between the magnetically enhanced LT-HDP-CVD plasma source and the substrate holder or positioned below the substrate holder inside or outside a vacuum chamber.

A method of providing magnetically enhanced LT-HDP-CVD thin film deposition includes (a) forming a magnetic field in the gap between a hollow cathode and an anode, (b) forming magnetic field lines perpendicular to a bottom surface of the hollow cathode, (c) positioning substrate, (d) providing feed gas, (e) applying negative voltage to the cathode, and (e) igniting volume plasma discharge.

The method of providing magnetically enhanced LT-HDP-CVD thin film deposition may include (a) applying heat to the substrate, (b) applying bias voltage to the substrate, (c) applying voltage to the pole piece, (d) applying pulse voltage to the cathode, (e) synchronizing pulse voltage applied to the pole piece and pulse voltage applied to the cathode target, (f) inductively grounding the substrate, (g) inductively grounding the cathode, (h) supplying feed gas through a gas activation source, and (i) inductively grounding the cathode, inductively grounding the pole piece.

A magnetically enhanced low temperature-high density plasma-chemical vapor deposition (LT-HDP-CVD) apparatus includes a hollow cathode assembly; an anode positioned on top of the hollow cathode target assembly, thereby forming a gap between the anode and the hollow cathode assembly; a cathode magnet assembly; a row of magnets that generate a magnetic field in the gap and a magnetic field on the hollow cathode surface with the cathode magnet assembly such that magnetic field lines are substantially perpendicular to the hollow cathode assembly; a power supply that generates a train of negative voltage pulses that generates a pulse electric field in the gap perpendicular to the magnetic field lines, the pulse electric field igniting and sustaining plasma during a pulse, a frequency, duration, and amplitude of the train of negative voltage pulses being selected to increase a degree of dissociation of the feed gas molecules atoms.

The apparatus may include a pole piece positioned adjacent to the gap and connected to the power supply, and a radio frequency (RF) power supply s connected to the hollow cathode assembly, wherein the RF power supply generates output voltage with a frequency in a range of about 1 MHz to 100 MHz. The apparatus may include a substrate holder, and an RF substrate bias power supply connected to the substrate holder. The apparatus may include an inductor connected between the substrate holder and ground. The apparatus may include a substrate holder, and a substrate bias power supply connected to the substrate holder, wherein the substrate bias power supply generates a bias voltage on the substrate in a range of about −10 V to −2000 V. The magnetic field in the gap may be in a range of about 50 G to 5000 G. The cathode magnetic array may be rotatable.

A method of magnetically enhanced low temperature-high density plasma-chemical vapor deposition (LT-HDP-CVD) includes providing a hollow cathode; forming a gap between the hollow cathode and an anode; positioning a cathode magnet assembly; generating a magnetic field in the gap such that magnetic field lines are substantially perpendicular to the hollow cathode surface; positioning a pole piece in the gap; providing a pulse power to the cathode target that ignites and sustains volume discharge; and generating a train of negative voltage pulses, wherein a frequency, duration, and amplitude of the train of negative voltage pulses being selected to increase a degree of dissociation and ionization of feed gas molecules and atoms.

The method may use a power supply connected to the pole piece, and may include connecting an RF power supply to the hollow cathode, and generating output voltage using the RF power supply with a frequency in a range of about 1 MHz and 100 MHz.

The power supply may generate an output voltage with a value in a range of about −100 V to −3000 V, and the method may include connecting a substrate bias power supply to a substrate holder, and generating bias voltage on the substrate in a range of about −10 V to −2000 V. The magnetic field in the gap may be in a range of about 50 G to 10000 G, and the cathode target material may include carbon.

A magnetically enhanced plasma apparatus includes a hollow cathode target assembly; an anode positioned on top of the hollow cathode target assembly, thereby forming a gap between the anode and the hollow cathode target assembly; a cathode magnet assembly; a row of magnets that generate a magnetic field in the gap and a magnetic field on a surface of the hollow cathode target assembly with the cathode magnet assembly such that magnetic field lines are substantially perpendicular to a surface of the hollow cathode target assembly; an electrode positioned adjacent to the row of magnets behind the gap; a first radio frequency (RF) power supply coupled to the electrode, wherein the electrode is coupled to ground through an inductor; and a second radio frequency (RF) power supply coupled to the hollow cathode target assembly. The second RF power supply ignites and sustains plasma in the hollow cathode target assembly. A frequency and power of the second RF power supply are selected to increase at least one of a degree of dissociation of feed gas molecules and degree of ionization of feed gas atoms. A frequency and power of the first RF power supply are selected to increase a degree of dissociation of feed gas molecules to form a layer from sputtering hollow cathode target material onto a substrate. A method of sputtering a layer on a substrate using magnetically enhanced plasma includes forming a gap between a hollow cathode target assembly and an anode on top of the hollow cathode target assembly; generating a magnetic field in the gap such that magnetic field lines are substantially perpendicular to a surface of the hollow cathode target assembly; connecting a first radio frequency (RF) power supply to an electrode positioned behind the gap, wherein the electrode is coupled to ground through an inductor; connecting a second radio frequency (RF) power supply to the hollow cathode target assembly that ignites and sustains volume discharge in the hollow cathode target assembly; and selecting a frequency and power of the first RF power supply to increase a degree of dissociation of feed gas molecules to form the layer from sputtering hollow cathode target material onto the substrate.

Other embodiments will become apparent from the following detailed description considered in conjunction with the accompanying drawings. It is to be understood, however, that the drawings are designed as an illustration only and not as a definition of the limits of any of the embodiments.

BRIEF DESCRIPTION OF THE DRAWINGS

The following drawings are provided by way of example only and without limitation, wherein like reference numerals (when used) indicate corresponding elements throughout the several views, and wherein:

FIG. 5 (*c, d*) show timing diagrams of RF voltages and pulse voltages that can be applied to the cathode assembly;

FIG. 6 (*e*) shows a timing diagram of RF voltage that can be applied to the inductively grounded cathode assembly;

FIG. 7 (*b*) shows an illustrative cross-sectional view of a multilayered film;

Figure 1A:
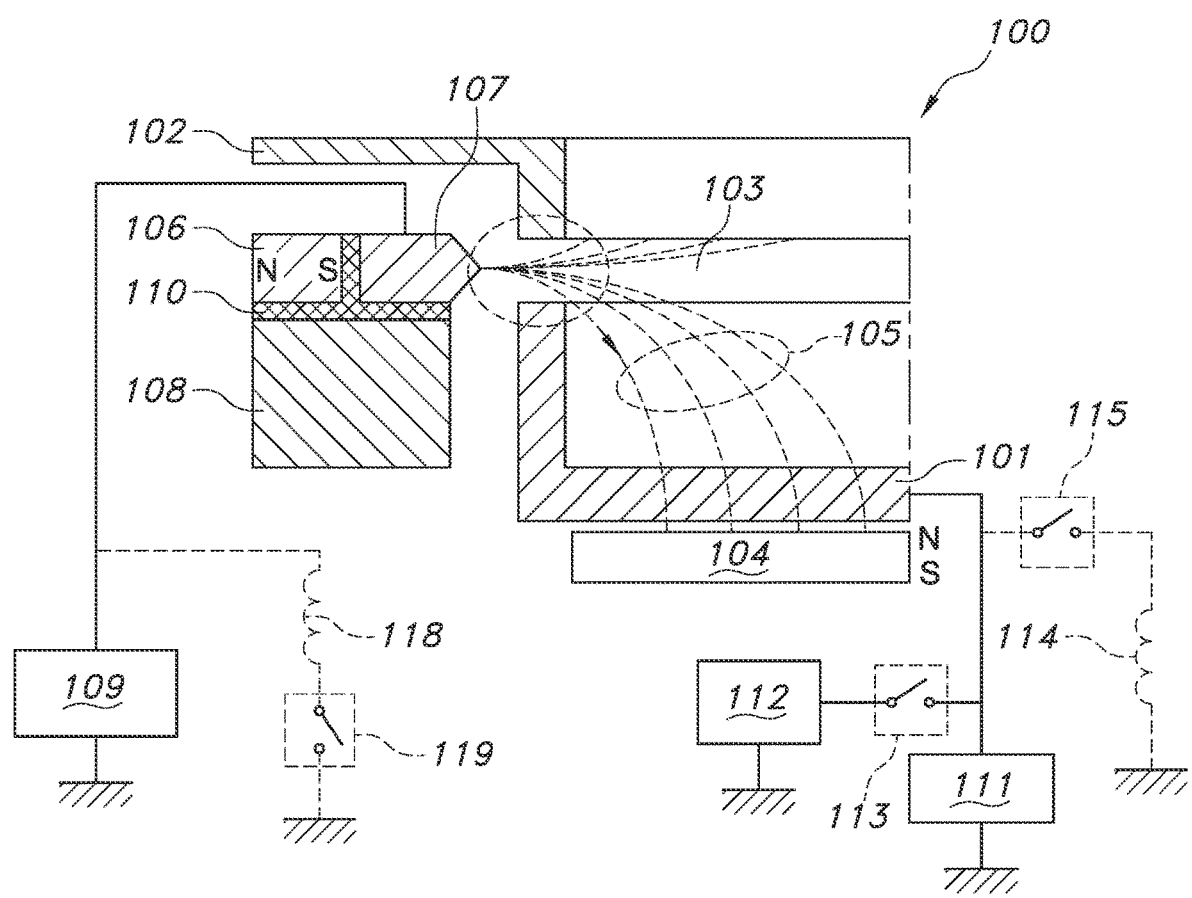
FIG. 1(a) shows an illustrative cross-sectional view of an embodiment of a magnetically enhanced LT-HDP-CVD source.
Figure 1B:
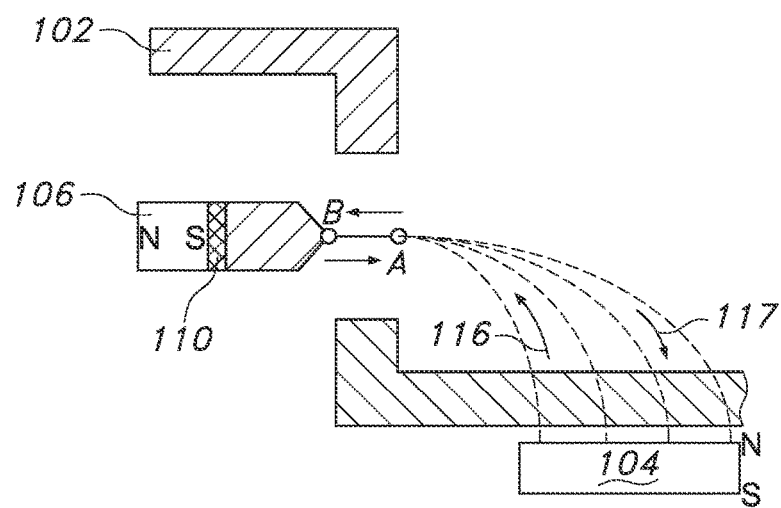
FIG. 1(b) shows an illustrative cross-sectional view of magnetic field lines for the magnetically enhanced LT-HDP-CVD source shown in FIG. 1(a)
Figure 1C:
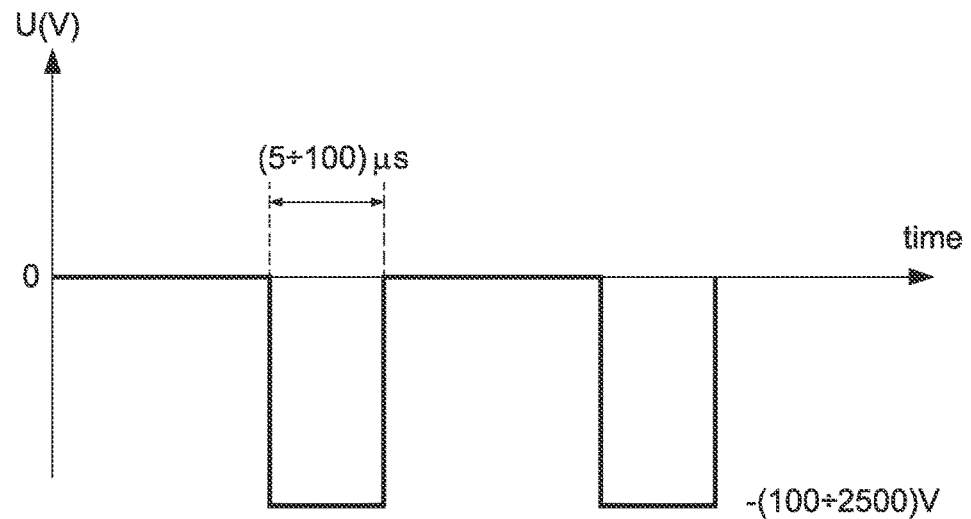
FIG. 1(c) shows a timing diagram of negative voltage pulses generated by a pulse power supply and applied to a pole piece from the LT-HDP-CVD source.
Figure 1D:
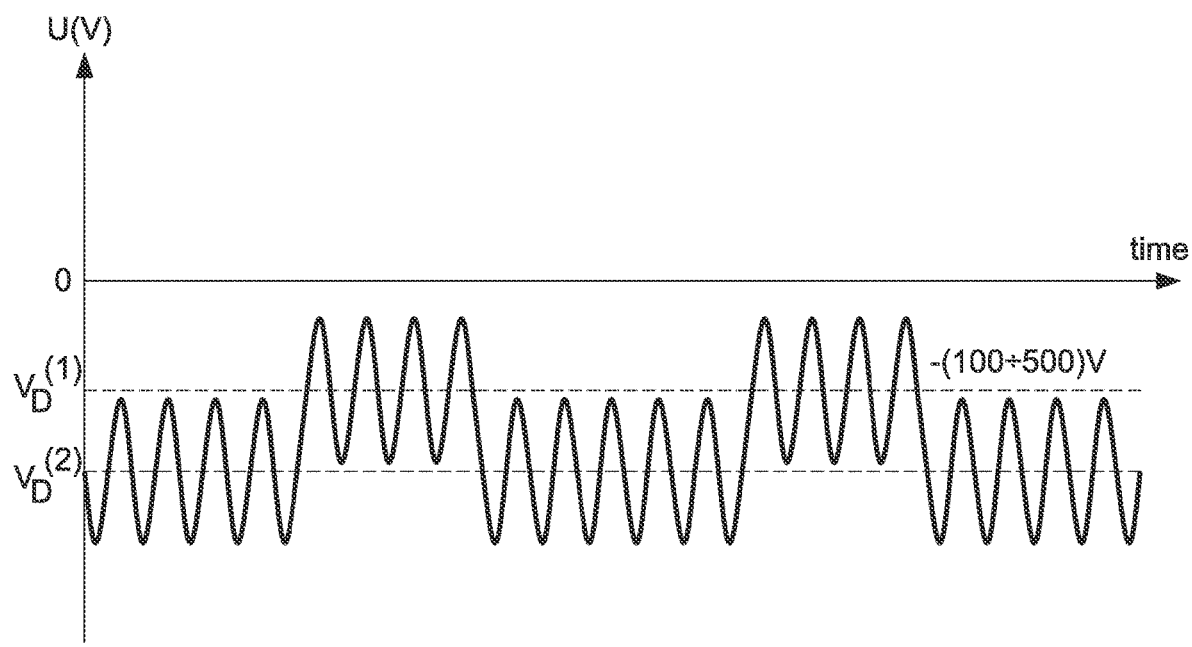
FIG. 1(d) shows a timing diagram of negative RF voltages applied to a cathode target when negative pulses are applied to the pole piece from the LT-HDP-CVD source.
Figure 1E:
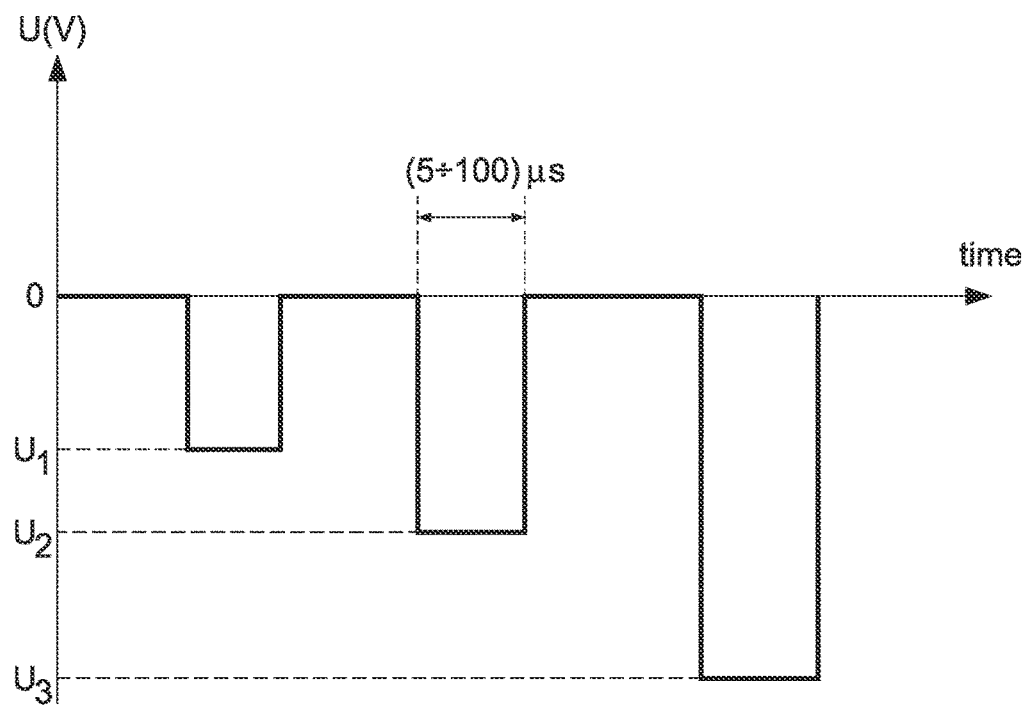
FIG. 1(e) shows a timing diagram of negative voltage pulses with different amplitudes that can be generated by a pulse power supply and applied to the pole piece from the LT-HDP-CVD source.
Figure 1F:
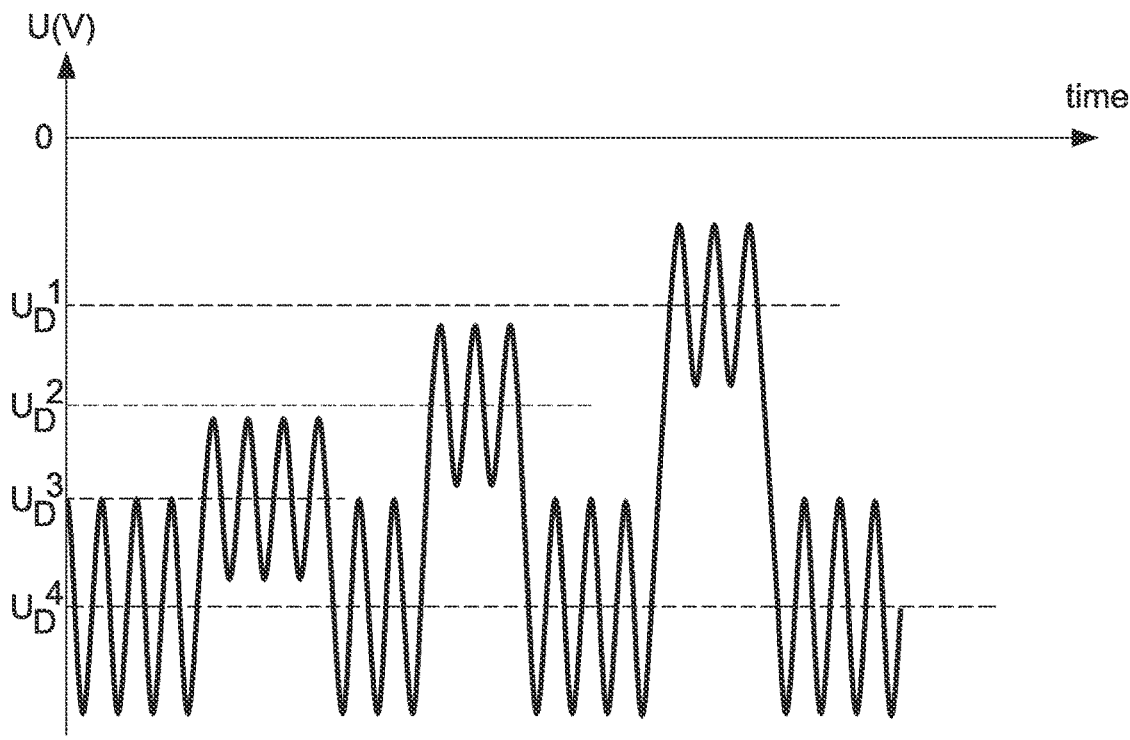
FIG. 1(f) shows a timing diagram of negative RF voltages applied to the cathode target when negative voltage pulses with different amplitudes are applied to the pole piece from the LT-HDP-CVD source.
Figure 1G:
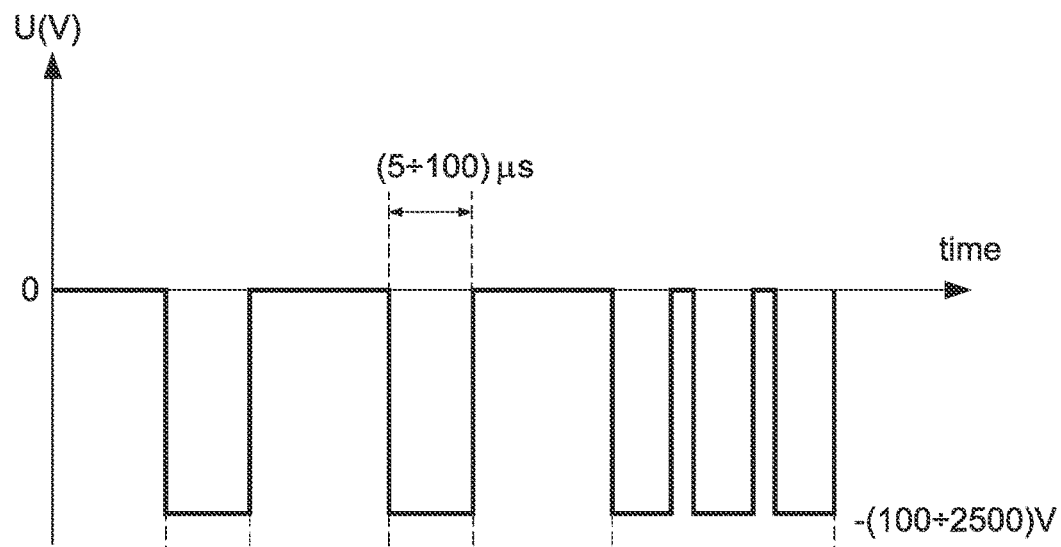
FIG. 1(g) shows a timing diagram of negative voltage pulses with different frequencies that can be generated by a pulse power supply and applied to the pole piece from the LT-HDP-CVD source.
Figure 1H:
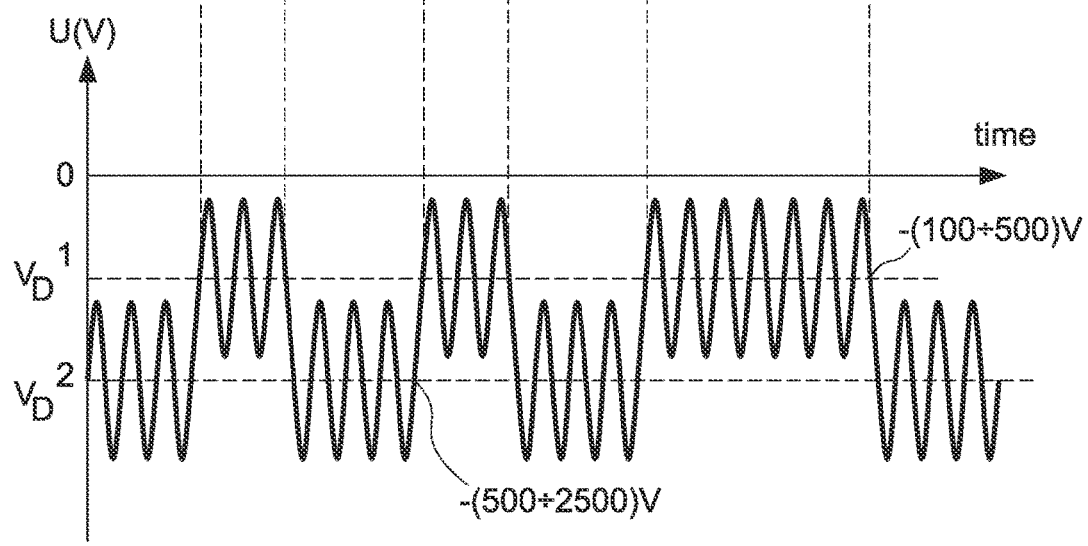
FIG. 1(h) shows a timing diagram of negative RF voltages applied to the cathode target when negative voltage pulses with different frequencies are applied to the pole piece from the LT-HDP-CVD source.
Figure 1I:
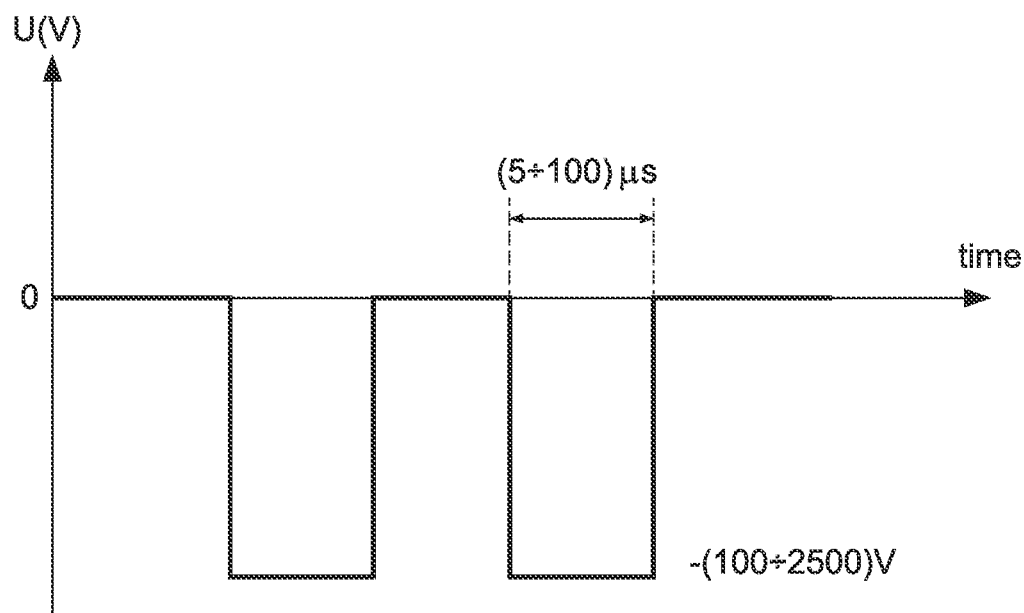
FIG. 1(i) shows a timing diagram of negative voltage pulses that can be generated by a pulse power supply and applied to the pole piece from the LT-HDP-CVD source.
Figure 1J:
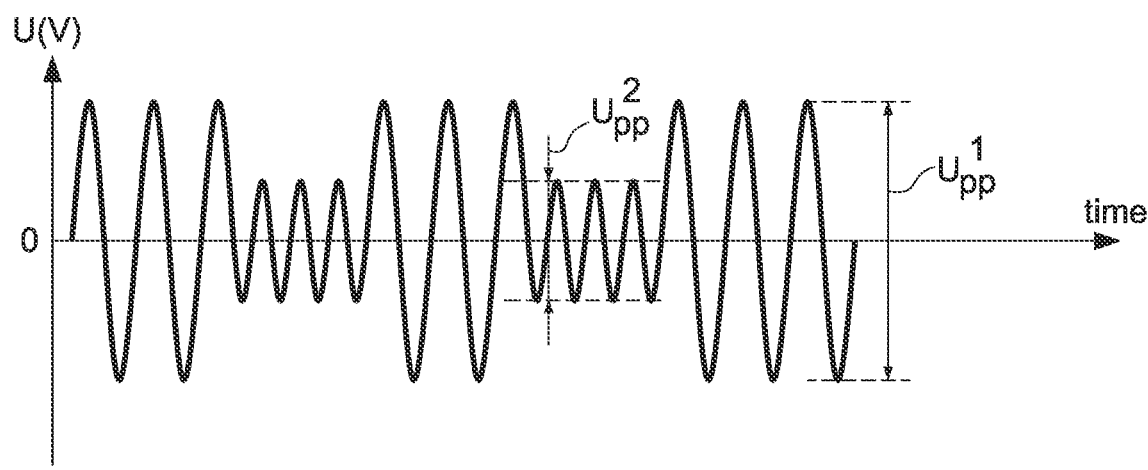
FIG. 1(j) shows a timing diagram of negative RF voltages applied to an inductively grounded cathode when negative voltage pulses with different frequencies are applied to the pole piece from the LT-HDP-CVD source.

It is to be appreciated that elements in the figures are illustrated for simplicity and clarity. Common but well-understood elements that are useful or necessary in a commercially feasible embodiment are not shown in order to facilitate a less hindered view of the illustrated embodiments.

DETAILED DESCRIPTION

Embodiments of a magnetically enhanced low temperature-high density plasma-chemical vapor deposition (LT-HDP-CVD) deposition source, when compared with conventional PE-CVD, have unique magnetic field geometry as shown in FIG. 1 (*a*). This geometry, on one side, forms a magnetic field in a gap between an anode and a hollow cathode and, on another side, forms magnetic field lines that cross a surface of the cathode substantially perpendicularly to the cathode surface. Therefore, magnetic field lines from one side terminate on the cathode surface, and from another side terminate in the gap on a pole piece that does not have the same potential as a cathode. This magnetic field geometry does not confine electrons near the cathode target surface. Rather, this magnetic field geometry allows electrons to move from the cathode surface toward the gap between the cathode and the anode. During this movement, the electrons dissociate the feed gas molecules, and ionize atoms. By the time these electrons come in contact with the pole piece in the gap, which concentrates the magnetic field in the gap, these electrons have lost a portion of their initial energy. A portion of the electrons drift back to the hollow cathode surface due to a magnetic mirror effect or a presence of negative potential on the pole piece. If electrons reach the hollow cathode surface during the time between voltage pulses when the hollow cathode voltage is equal to zero, these electrons discharge a positive charge on top of the cathode surface and significantly reduce or eliminate the probability of arcing on the cathode target surface during the LT-HDP-CVD process. The positive charge on the hollow cathode target surface can be formed due to the formation of low electrical conductivity films during the LT-HDP-CVD process. The amount of electrons returning to the hollow cathode surface can be controlled by selecting the magnetic field geometry, gas pressure, amplitude, duration, and distance between applied voltage pulses, and/or the duration and value of negative potential on the pole piece.

The magnetically enhanced LT-HDP-CVD source 100 has a hollow cathode 101 and an anode 102 that forms a gap 103 as shown in FIG. 1 (*a*). The hollow cathode has a magnetic assembly 104 positioned behind the hollow cathode 101. The magnetic assembly 104 can be stationary, rotatable, or movable. The magnetic assembly can include magnets and magnetic pole pieces. Magnetic field lines 105 are substantially perpendicular to the hollow cathode surface. The gap 103 has a magnet assembly comprising a row of magnets 106 and a pole piece 107. This pole piece 107 can be made from magnetic or nonmagnetic material. If the pole piece 107 is made from magnetic material, the pole piece 107 concentrates the magnetic field, which can increase a magnetic mirror effect for the electrons drifting from the cathode surface 101 towards the gap 103. The pole piece 107 is exposed to the plasma through the gap 103. The pole piece 107 and magnets 106 are positioned on supporter 108. The pole pieces 107 can be connected to voltage power supply 109 or can be grounded or isolated from ground. In some embodiments, pole piece 107 can be inductively grounded through inductor 118 and switch 119. In some embodiments, power supply 109 is an RF power supply that generates voltage with frequencies in a range 100 kHz to 100 MHz. Pole piece 107 is isolated from the supporter 108 and magnets 106 by isolators 110. The cathode is connected to power supply 111. The cathode can be also connected to another power supply 112 through switch 113. In some embodiments, power supply 111 is a radio frequency (RF) power supply and power supply 117 is a pulse power supply. These power supplies generate an RF-pulse superimposed discharge. In some embodiments only the RF power supply 111 is connected \to the cathode 101. In this case, the cathode 101 can be inductively grounded through inductor 114 and switch 115. If the cathode target is inductively grounded, RF discharge cannot generate a constant negative voltage bias and there is sputtering from the cathode does not occur. In some embodiments, only one power supply 112 is connected to the cathode 101 and generates negative voltage pulses. Magnetic field lines 105 guide the electrons from the hollow cathode surface toward a gap between the anode and the hollow cathode as shown in FIG. 1 (*b*) by arrow 116. By the time the emitted electrons arrive at the gap, a portion of their initial energy has been lost due to dissociation, ionization, and/or elastic and/or non-elastic collisions with neutral atoms, molecules ions, and/or other electrons from the feed gas. One portion of the electrons reflect from point "A" due to a magnetic mirror effect and another portion of the electrons reflect from point "B" due to the presence of a negative potential on pole piece 107. If pole piece 107 has a ground potential, electrons are absorbed. Therefore, by controlling the electrical potential on pole piece 107, the plasma density near the cathode can be controlled. Plasma density controls the degree of feed gas dissociation and ionization. The electrons drift back from the gap towards the hollow cathode surface as shown by arrow 117. A negative voltage on the pole piece 107 is preferably less than −50 V in order to prevent possible sputtering from the pole piece 107. In some embodiments, negative voltage pulses with a duration in a range of 5-100 µs, amplitude of 100-2000 V, and a frequency of up to about 100 kHz are applied to the pole piece 107. The voltage pulse can be triangular, rectangular, trapezoidal, or any other shape. Voltage pulses can be negative, bipolar, or positive. The application of negative high voltage pulses increase the energy of the electrons reflected from the pole piece 107 and, therefore, the plasma density. FIG. 1 (c) shows negative voltage pulses generated by power supply 109 when cathode target from LT-HDP-CVD source is connected to RF power supply 111. Pulse negative voltage increases electron energy in RF discharge and, therefore, increases plasma density. As a result, in some embodiments, the negative voltage bias generated by RF power supply 111 is reduced during the pulse from $U_D^2$ to $U_D^1$ as shown in FIG. 1 (d). FIG. 1 (e) shows negative voltage pulses with different amplitude $U^1$-$U^3$ generated by power supply 109. Pulse voltage increases the amount of electrons and, therefore, increases the plasma density. A greater negative pulse voltage amplitude $U^3$ generates greater plasma density and, therefore, will requires a less negative voltage bias $U_D^1$ generated by the RF power supply. As a result, in some embodiments, the discharge voltage generated by RF power supply 111 is reduced during the pulse as shown in FIG. 1 (f). In some embodiments, the influences of the frequency of the negative voltage pulses generated by power supply 109 on discharge voltage generated by RF power supply 111 or 118 is shown in FIGS. 1 (g, h). FIG. 1 (g) shows negative voltage pulses with different frequencies generated by power supply 109. As a result, in some embodiments, the discharge voltage generated by RF power supply 111 is reduced during the pulses as shown in FIG. 1 (h). FIG. 1 (i) shows negative voltage pulses generated by power supply 109. As a result, in some embodiments, the peak-to-peak voltage $U_{pp}^1$ generated by RF power supply 111 connected to the inductively grounded cathode target 101 is reduced during the pulse $U_{pp}^2$ as shown in FIG. 1 (j). Depending on the voltage amplitude, duration, and shape of the voltage pulses applied to the hollow cathode 101 and the voltage applied to the pole piece 107 and feed gas pressure, the electrons move back and forth between the cathode target and the gaps.

Figure 2:
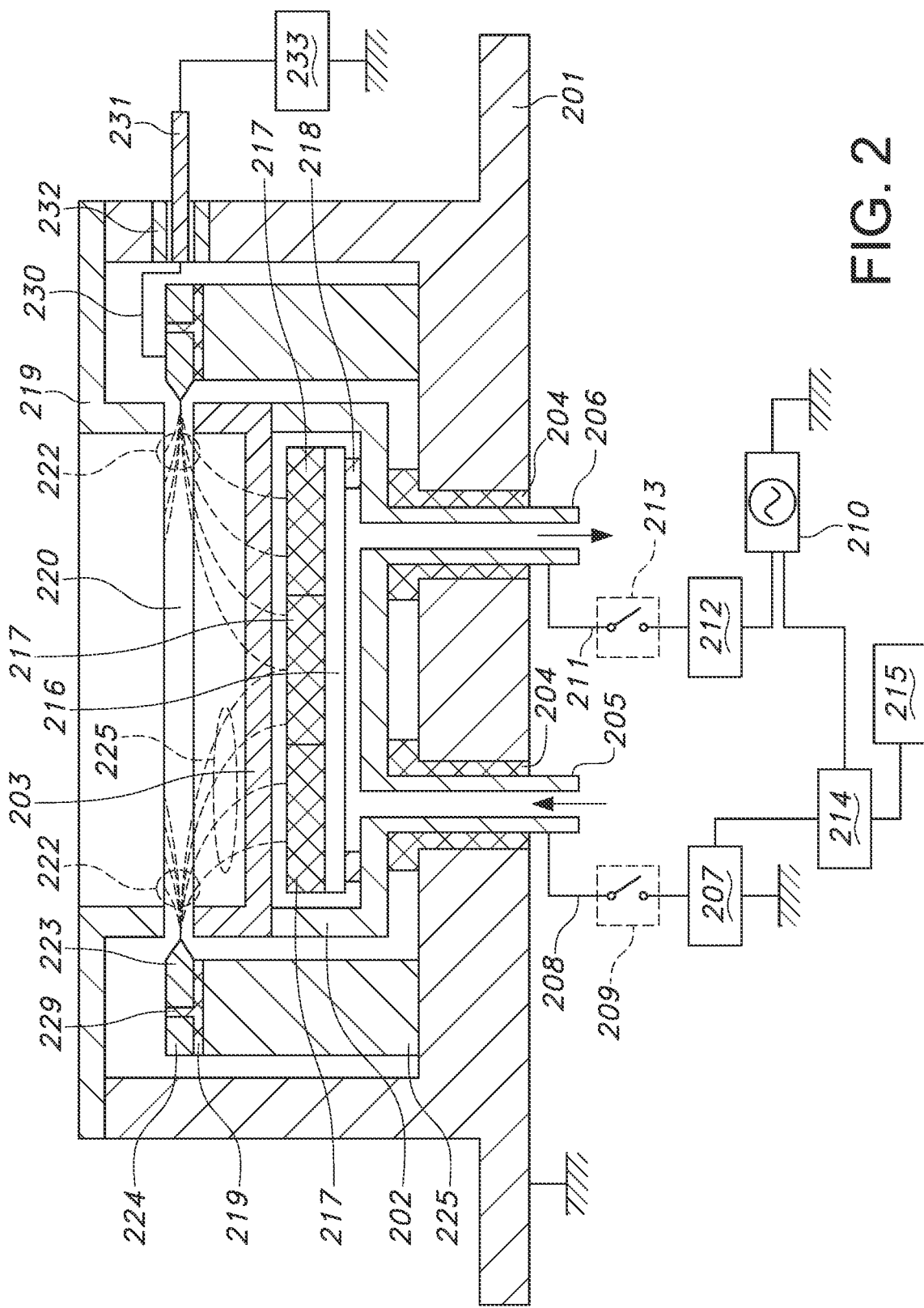
FIG. 2 shows an illustrative cross-sectional view of an embodiment for a magnetically enhanced LT-HDP-CVD source.

FIG. 2 shows a cross-sectional view of an embodiment of the magnetically enhanced LT-HDP-CVD deposition source 200. The magnetically enhanced LT-HDP-CVD deposition source 200 includes a base plate 201. The base plate has an electrical ground potential. The cathode assembly includes a water jacket 202 and a hollow cathode 203. The water jacket 202 is electrically isolated from the base plate 201 with isolators 204. Water or another fluid for cooling can move inside the water jacket 202 through inlet 205, and can move outside the water jacket 202 through outlet 206. The hollow cathode 207 is positioned on top of water jacket 202. The hollow cathode 203 is electrically connected to power supply 207 through a water inlet 205, transmission line 208, and switch 209. The power supply 207 can include a direct current (DC) power supply, a pulsed power supply that generates unipolar negative voltage pulses, a pulsed power supply that generates asymmetrical bipolar voltage pulses, a pulsed power supply that generates symmetrical bipolar voltage pulses, an RF power supply, and/or a high power pulsed power supply. Any of these power supplies can generate different shapes, frequencies, and amplitudes of voltage pulses. These power supplies can work in power control mode, voltage control mode, or current control mode. The water inlet 206 is electrically connected to a power supply 210 through a transmission line 211, matching network 212, and a switch 213. A power supply 210 can include a radio frequency (RF) power supply, pulsed RF power supply, high frequency (HF) power supply, pulsed HF power supply, or any combination of these supplies. The frequency can be in the range of 100 kHz to 100 MHz. Power supply 210 can operate together with power supply 207 or can operate alone without connecting power supply 207 to the cathode assembly. Power supply 207 can operate together with power supply 210 or can operate alone without connecting power supply 210 to the cathode assembly. The hollow cathode 203 can be powered with any combination of the power supplies mentioned above. All of the above-mentioned power supplies can operate in current control mode, voltage control mode, and/or power control mode. Power supply 207 and power supply 210 can be connected to the same water inlet 205. The cathode 203 is formed in the shape of a round hollow shape, but can be formed in other shapes, such as a rectangular hollow shape, disc, and the like. The hollow cathode 203 material can be conductive, semi-conductive, and/or non-conductive. The following chemical elements, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements or their combination with gases $O_2$, $N_2$, F, Cl, and/or $H_2$ can also be used as a cathode material. Power supplies 207, 210, and switches 209, 213 can be connected to the controller 214 and computer 215. Controller 214 and/or computer 215 control the output voltage values and timing of the power supplies 207 and 210. The power supplies 207 and 210 can be synchronized.

The cathode assembly includes a stationary cathode magnetic assembly 216 positioned inside the water jacket 202. The cathode magnetic assembly 216 in an embodiment includes a plurality of magnets 217. The magnetic assembly 216 is mounted on a plate 218 that is made from non-magnetic material. The presence of magnets 217 provides for a perpendicular direction of the magnetic field lines to the surface of the cathode 203. In an embodiment, the cathode magnetic assembly 216 (stationary or rotatable) includes a plurality of permanent magnets and magnetic pole pieces. In an embodiment, the magnetic assembly 216 is rotatable. In an embodiment, the magnetic assembly 216 is kidney-shaped. The magnetic assembly 216 can rotate with a speed in the range of 1-500 revolutions per minute.

A ring-shaped anode 219 is positioned proximate to the hollow cathode 203. The anode 219 and the hollow cathode 203 form a circular gap 220. The electric field lines are perpendicular to the magnetic field lines in the gap 220. Magnetic field lines 221 are substantially perpendicular to the cathode surface 203. In embodiment a feed gas is fed through the gap 220 between the hollow cathode 203 and the anode 219.

A magnet assembly that generates magnetic field 222 is positioned around the gap 220. The magnetic assembly includes magnetic ring-shaped pole pieces 223 and a plurality of permanents magnets 224. The magnets 224 are positioned inside the magnet housing (not shown in FIG. 2). The value of the magnetic field in the gap 220 caused by the permanents magnets 224 is in a range of 100-10000 G. The pole piece 223 and magnets 224 are mounted on top of the support 225.

Power supplies 207 and 210 are connected to the controller 214. Controller 226 can be connected to a computer 215. Controller 214 controls the output voltage signals from the power supplies 207, 212.

The pole piece 223 is electrically isolated from the magnet 224 by isolator 229. The pole piece 223 is electrically isolated from the support 225 by isolator 219.

The magnetic fields 222 and are shaped to provide electron movement between the hollow cathode 203 and pole piece 223. During this movement, electrons dissociate and ionize feed gas molecules and/or atoms and sputtered target material atoms.

Pole piece 223 is connected to voltage control mode power supply 233 through electrode 231 and transmission line 230. Electrode 231 is isolated from the base plate by isolator 232. In an embodiment, the magnets 213, 212 are electromagnets. In embodiment power supply 233 is RF power supply. In embodiment pole piece 223 can be grounded through inductor.

Figure 3:
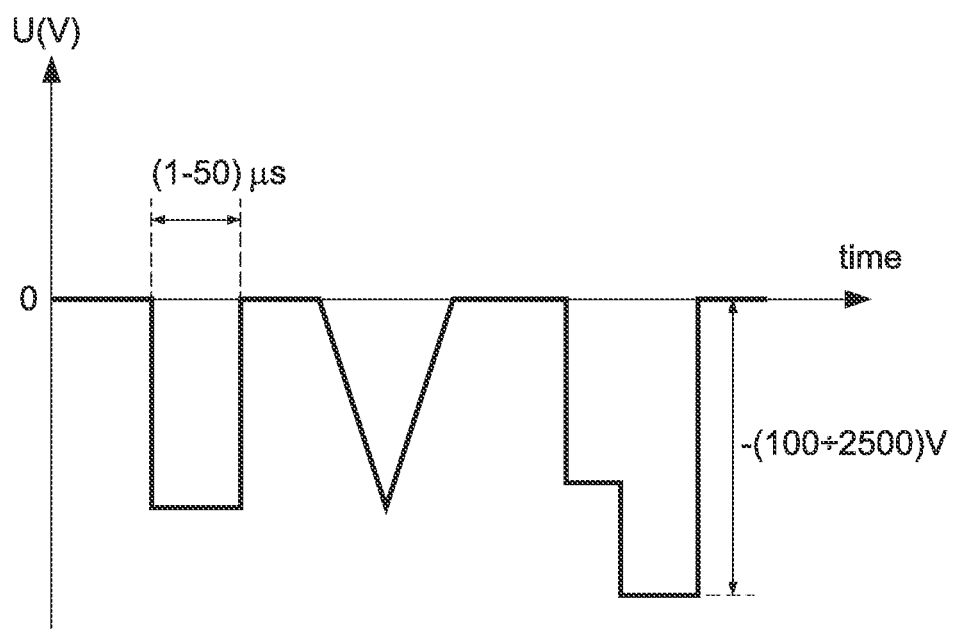
FIG. 3 shows a timing diagram of negative voltage pulses that can be generated by a pulse power supply and applied to the pole piece.
Figure 4A:
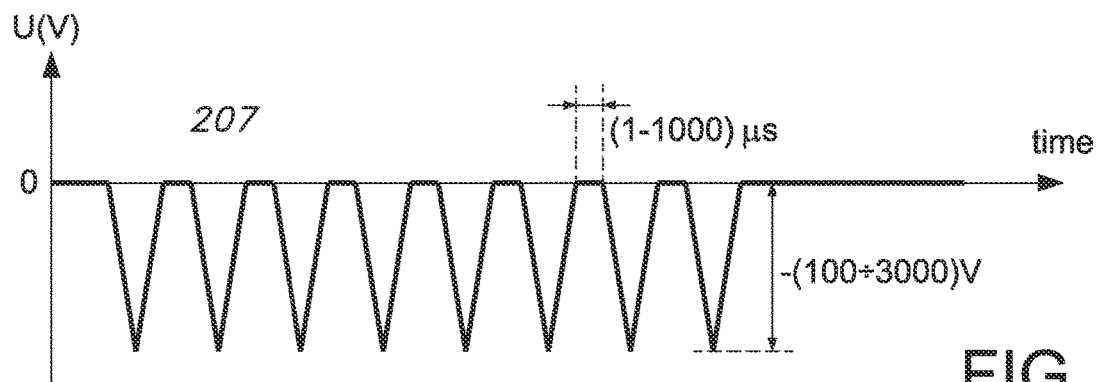
FIG. 4 (a, b, c, d) show timing diagrams of negative voltage pulses that can be generated by a pulse power supply and applied to the cathode assembly.
Figure 4B:
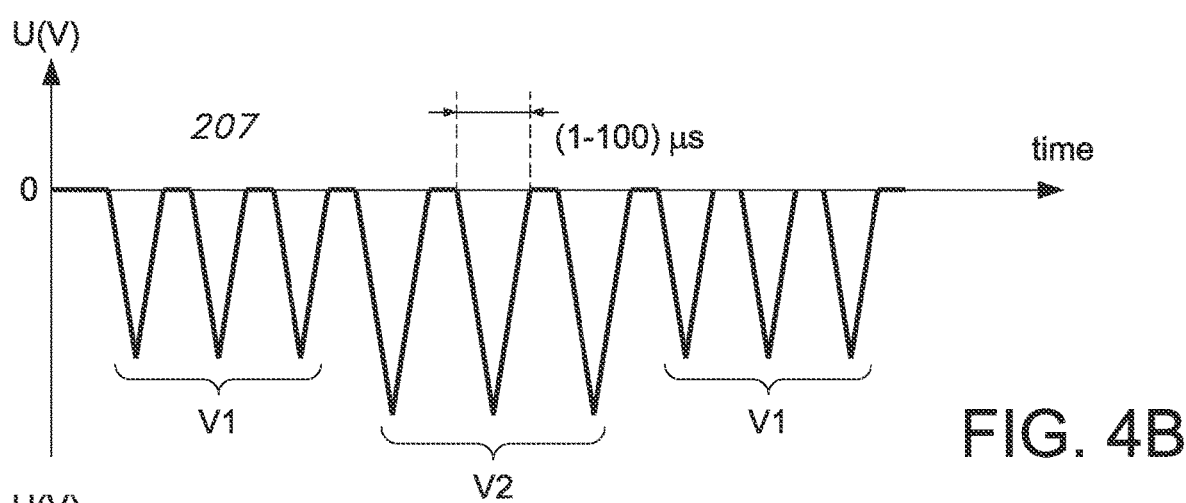
Figure 4C:
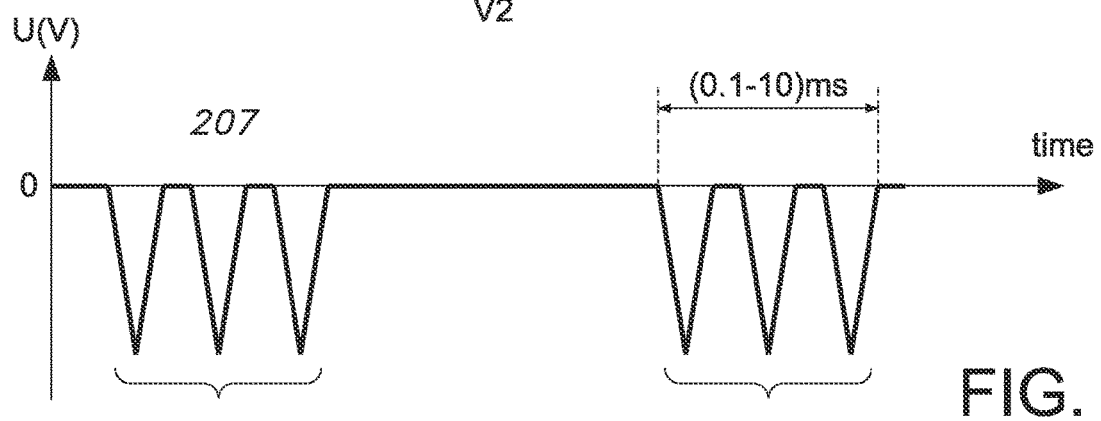
Figure 4D:
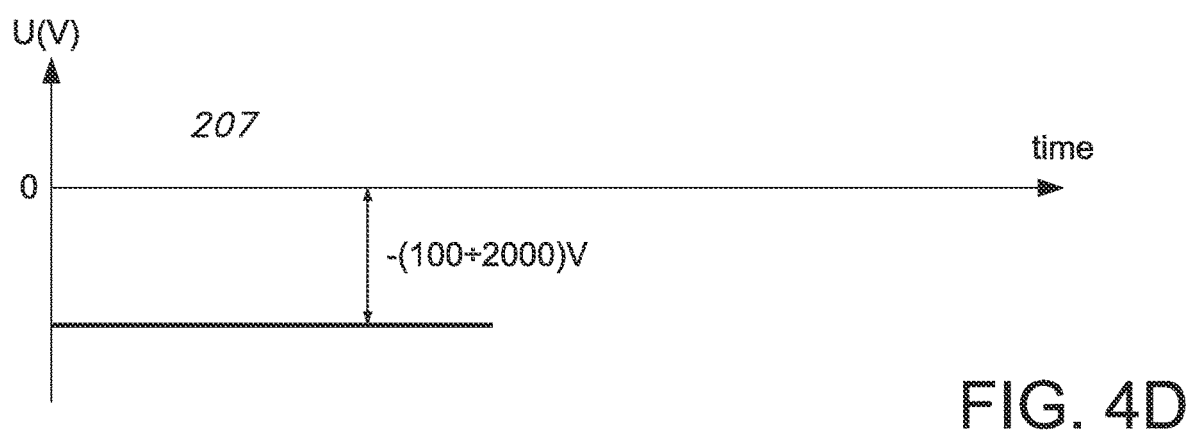
Figure 5A:
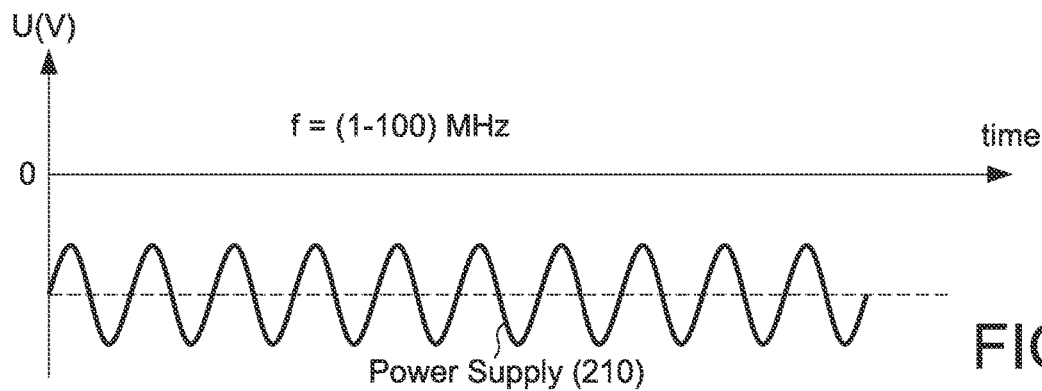
FIG. 5 (a, b) show timing diagrams of RF voltages that can be applied to the cathode assembly.
Figure 5B:
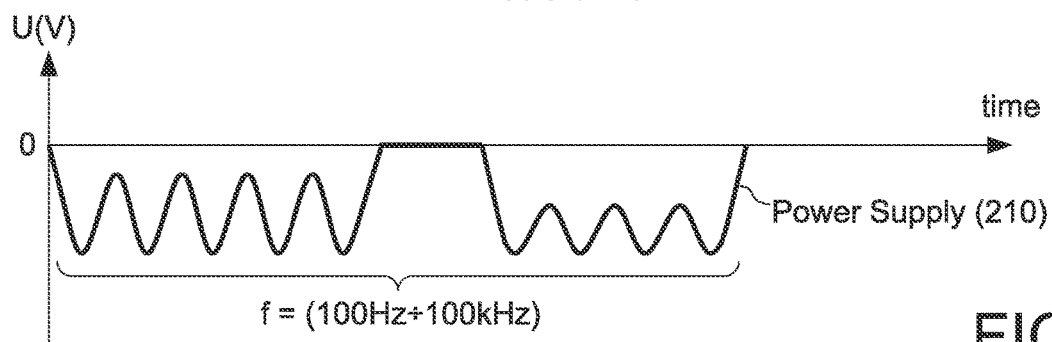
Figure 5C:
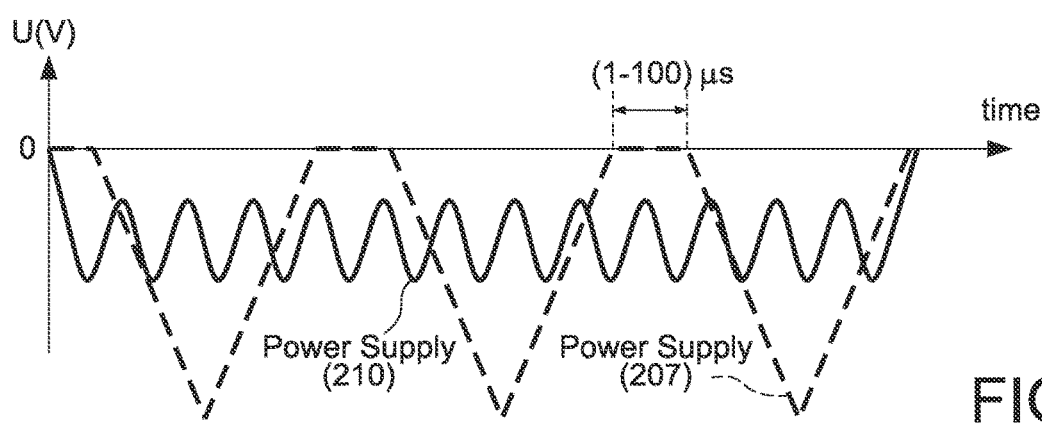
Figure 5D:
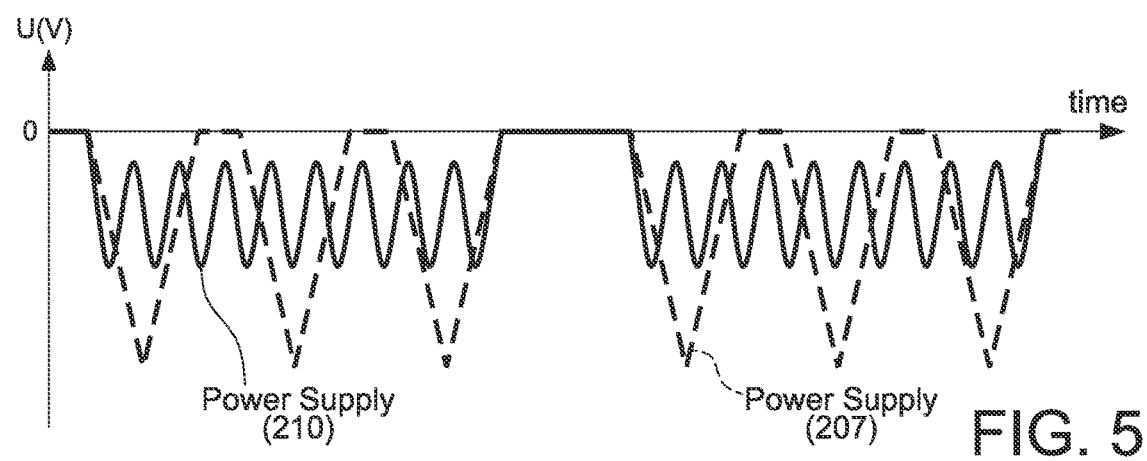
Figure 6A:
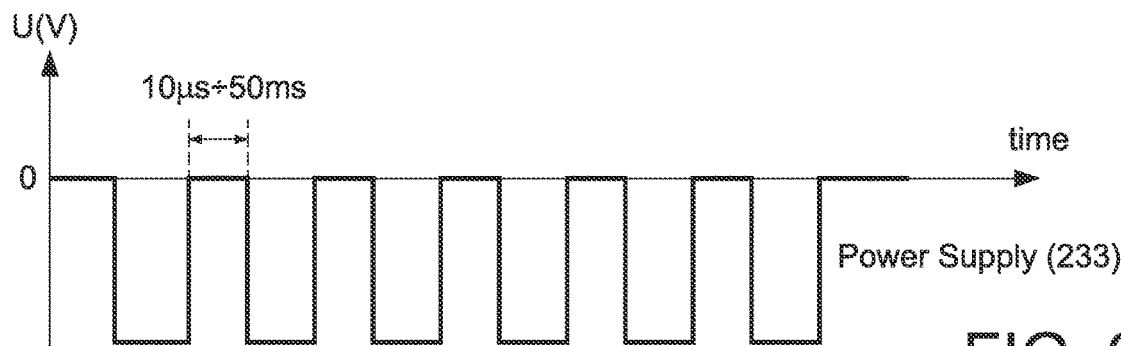
FIG. 6 (*a, b, c, d*) show timing diagrams of different shapes of voltage pulses that can be applied to the cathode assembly.
Figure 6B:
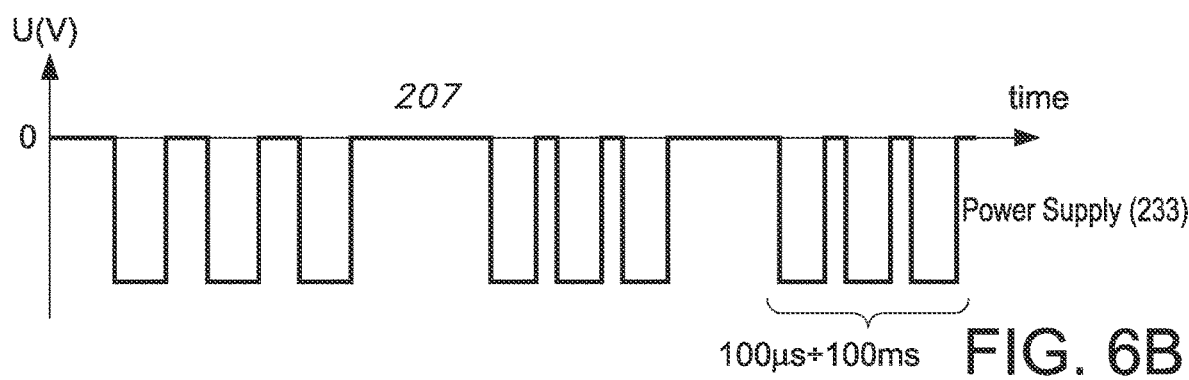
Figure 6C:
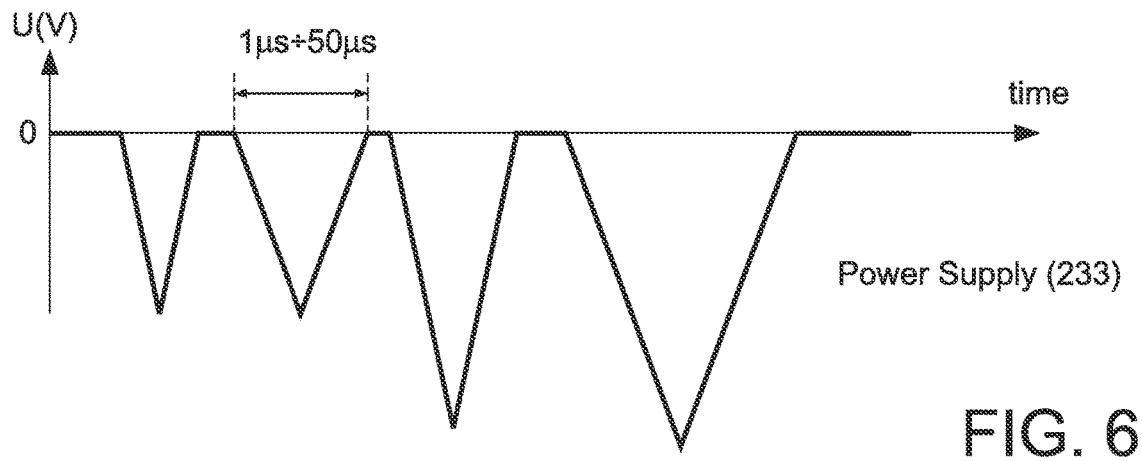
Figure 6D:
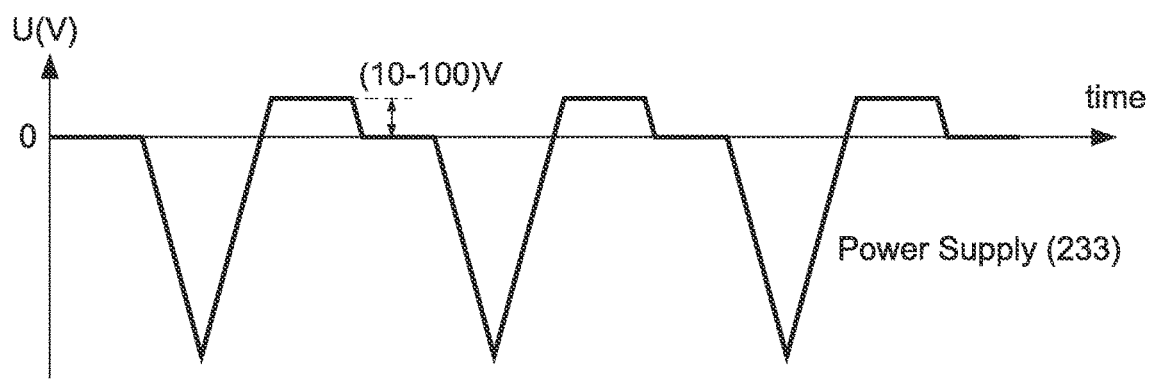
Figure 6E:
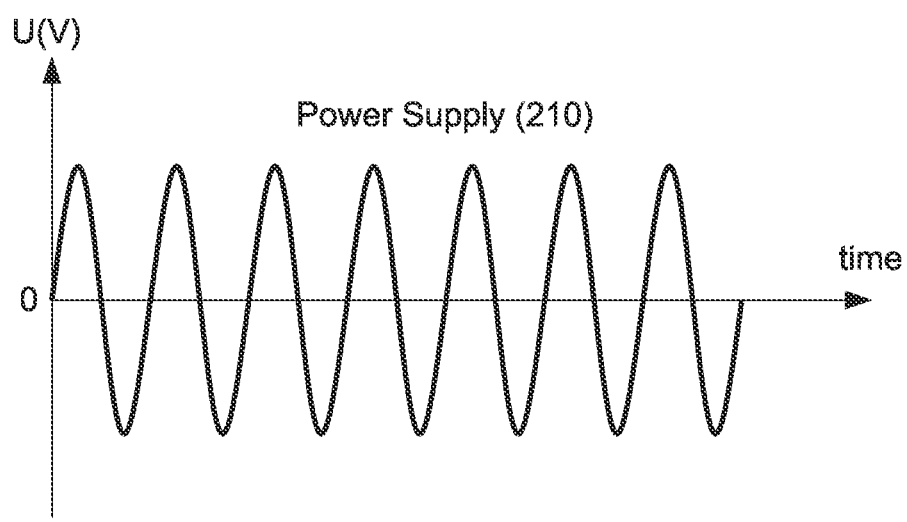

FIG. 3 shows voltage pulse shapes that can be generated by power supply 233. The amplitude of negative voltage pulses can be in the range of 100 to 2500 V. The pulse duration can be in the range of 1 to 50 µs.

FIG. 4 (a, b, c, d) show different voltage pulse shapes, amplitudes, and frequencies that power supply 207 can provide. Typically, in order to generate and sustain volume discharge, the power supply 207 operates in power control mode or in voltage control mode. FIG. 4 (a) shows a continuous train of triangular negative voltage pulses. The amplitude can be in the range of 100-3000 V. FIG. 4 (b) shows a train of negative voltage pulses that has different voltage amplitudes. The voltage pulses with amplitude V1 can be optimized to increase the dissociation rate of feed gas molecules, and voltage pulses with amplitude V2 can be optimized to increase the ionization rate of the atoms, in particular carbon atoms. The pulse voltage provides energy to the electrons in the plasma discharge. For example, voltage V1 is optimized to increase the dissociation rate of gas molecules containing carbon atoms, such as $C_2H_2$, $CH_4$, CO, $CO_2$, $C_3H_8$, $CH_3OH$, $C_2H_5OH$, $CH_3Cl$, and the like. Also, it is important to increase the dissociation rate of $H_2$ ($H_2+e \rightarrow H_2^* +e \rightarrow H+H+e$). The high-voltage pulse amplitude V2 provides more energy to the electrons. Electrons collide with gas molecules, gas atoms, and target material atoms. Typically, gas atoms need more energy in order to be ionized and molecules need less energy to dissociate. That is, if the voltage amplitude is high then the probability of ionization of atoms will be high. The pulse duration can be in the range of 1 microsecond to 1 millisecond. FIG. 4 (c) shows a pulse train of triangular negative voltage pulses. The duration of the train of negative voltage pulses can be in the range of 100 microseconds to 10 milliseconds. The frequency of the train of negative voltage pulses can be in the range of 100 Hz to 20 KHz. FIG. 4 (d) shows a continuous voltage that can be in the range of −100 to −2000 V.

FIG. 5 (a) and FIG. 5 (b) show continuous and pulse RF voltages that can be provided by power supply 210. The RF power can be in the range of 100 W to 10 kW. The RF frequency can be in the range of 100 kHz to 100 MHz. The frequency of RF pulses can be in the range of 100 Hz to 100 KHz. FIG. 5 (c) shows voltage on the hollow cathode 203 when power supply 210 provides a continuous train of triangular voltage pulses and power supply 210 simultaneously provides continuous RF voltage. FIG. 5(d) shows voltage on the cathode when power supply 207 provides a train of triangular voltage pulses and power supply 210 simultaneously provides pulse RF voltages. Power supply 233 can generate a continuous train of rectangular negative voltage pulses as shown in FIG. 6 (a). Power supply 233 can generate a pulse train of rectangular negative voltage pulses as shown in FIG. 6 (b). The duration of the pulse train of voltage pulses can be in the range of 100 µs to 10 ms. FIG. 6 (c) shows different voltage pulse shapes in one pulse train. FIG. 6 (d) shows a train of asymmetric bi-polar voltage pulses when negative pulse voltage has a triangular shape. FIG. 6 (e) shows continuous RF voltages generated by power supply 210 on the inductively grounded hollow cathode 203.

Figure 7A:
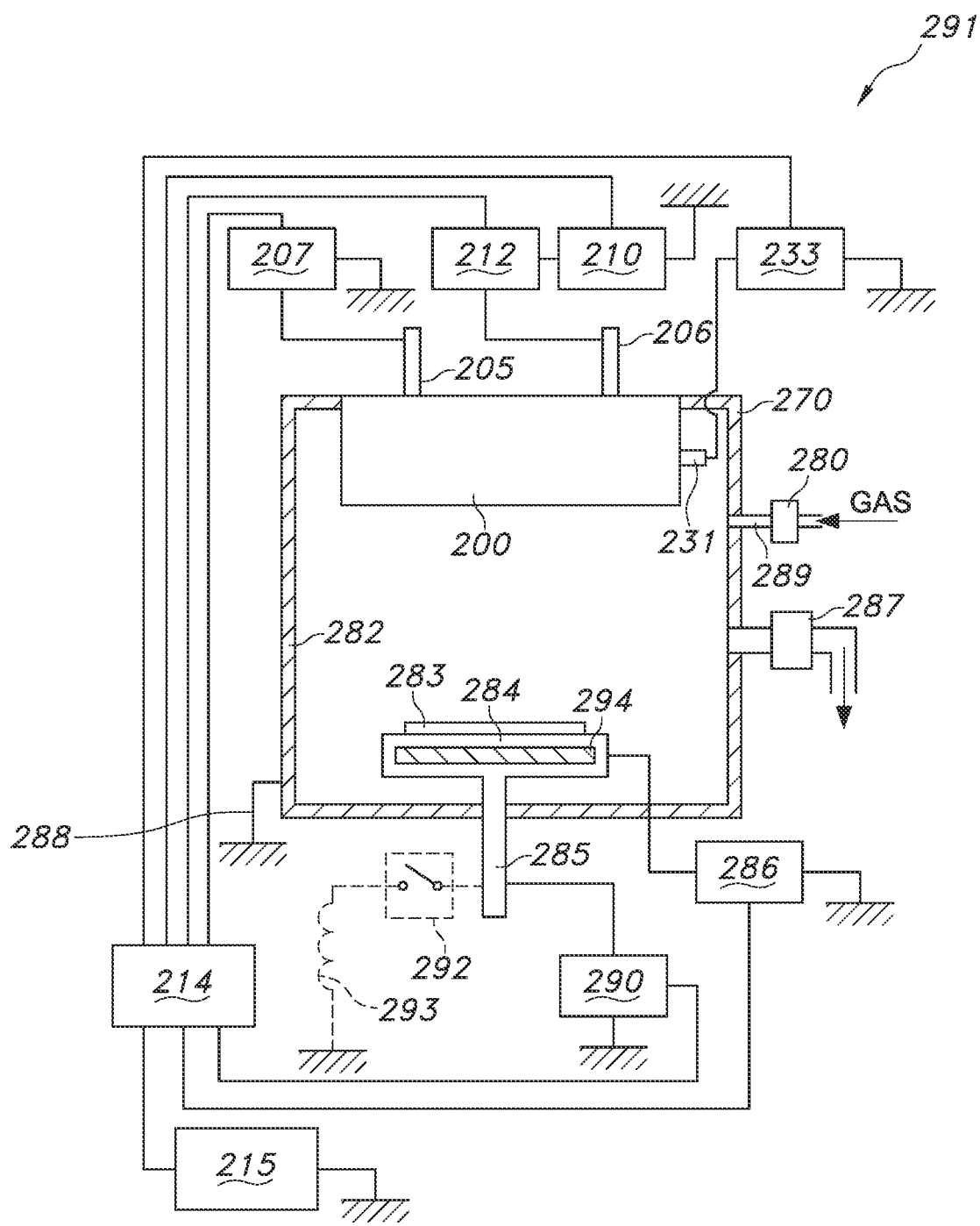
FIG. 7 (*a*) shows an illustrative cross-sectional view of an embodiment of a magnetically enhanced LT-HDP-CVD system for thin film deposition.
Figure 7B:
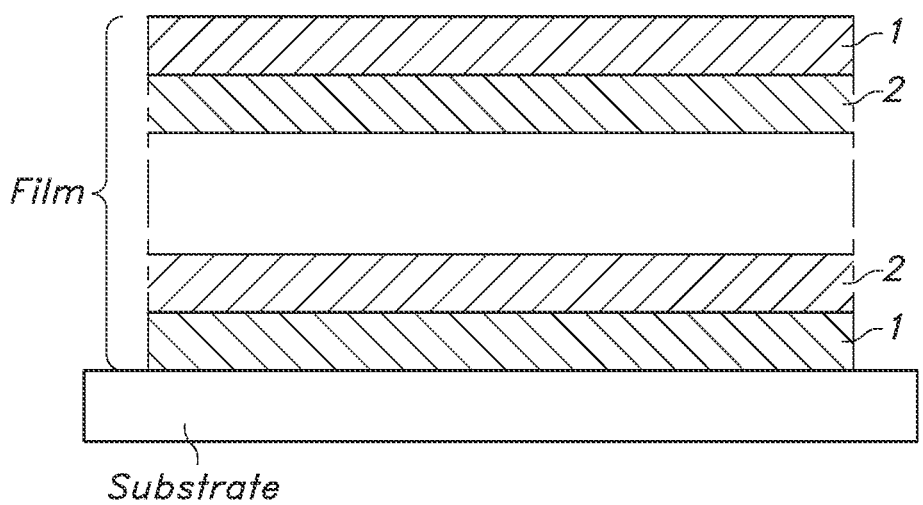

The magnetically enhanced LT-HDP-CVD deposition source 200 can be mounted inside the vacuum chamber 201 in order to construct the magnetically enhanced LT-HDP-CVD apparatus 291 as shown in FIG. 7 (a). The vacuum chamber 270 contains feed gas and plasma. The vacuum chamber 270 is coupled to ground 288. The vacuum chamber 270 is positioned in fluid communication with a vacuum pump 287, which can evacuate the feed gas from the vacuum chamber 270. Typical baseline pressure in the vacuum chamber 270 is in a range of $10^{-5}$ to 10' Torr.

A feed gas is introduced into the vacuum chamber 270 through a gas inlet 289 from a feed gas source. A mass flow controller 280 controls gas flow to the vacuum chamber 270. In an embodiment, vacuum chamber 270 has many gas inlets and mass flow controllers. The gas flow can be in a range of 1 to 1000 SCCM depending on plasma operating conditions, pumping speed of the vacuum pump 287, process conditions, and the like. In some embodiments, the feed gas is introduced through the gap 220 shown in FIG. 2 using the magnetically enhanced LT-HDP-CVD 200. Typical gas pressure in the vacuum chamber 270 during a CVD process can be in a range of 0.1 mTorr to 50 Torr. In an embodiment, a plurality of gas inlets and a plurality of mass flow controllers sustain a desired gas pressure during the CVD process. The plurality of gas inlets and plurality of mass flow controllers may be positioned in the vacuum chamber 270 at different locations. The feed gas can be a noble gas, such as Ar, Ne, Kr, Xe; a reactive gas, such as $N_2$, $O_2$; or any other gas that is suitable for CVD processes. For depositing DLC or diamond films, the feed gas contains atoms of carbon. For example, the cathode target material can be carbon. The feed gas can be $C_2H_2$, or $CH_4$ or any other gas/vapor containing carbon atoms, such as CO, $CO_2$, $C_3H_8$, $CH_3OH$, $C_2H_5OH$, and $CH_3Cl$. The feed gas can also be a mixture of different of gases. In some embodiments, the cathode target material is not a carbon. In some embodiments, the cathode target material is carbon. The LT-HDP-CVD source is connected to power supply 207 through water inlet 205, and power supply 210 with matching network 212 are connected to water outlet 206. In some embodiments, only power supply 207 is connected to the LT-HDP-CVD source. In some embodiments only power supply 210 is connected to the LT-HDP-CVD source.

The magnetically enhanced LT-HDP-CVD apparatus 291 includes a substrate support 284 that holds a substrate 283 or other work piece for plasma processing. The substrate support 284 is electrically connected to bias voltage power supply 290 through connector 285. The bias voltage power supply 290 can include a radio frequency (RF) power supply, alternating current (AC) power supply, very high frequency (VHF) power supply, and/or direct current (DC) power supply. The bias power supply 290 can operate in continuous mode or in pulse mode. The pulse substrate bias voltage can be synchronized with pulse voltage applied to the cathode 203. The bias power supply 290 can be a combination of different power supplies that can provide different voltage oscillation frequencies. The negative bias voltage on the substrate 283 can be in a range of −1 to −2000 V. The negative substrate bias voltage can attract positive ions to the substrate 283. In some embodiments, substrate holder 284 is inductively grounded through switch 292 and inductor 293 and is connected to RF power supply 286. During operation, there is no negative constant bias. There are only RF voltage oscillations on a surface of the substrate 283 that promote dissociation and ionization of the carbon containing gas. In some embodiments, switch 292 closes and opens with a frequency of 1 Hz to 100 kHz. When switch 292 is open, the RF voltage bias is present and ions bombard the growing film. When switch 292 is closed, the RF voltage bias is equal to zero and ions are not bombarding the growing film. In some embodiments, switch 292 can be repetitively closed during the time in a range of 1 sec to 100 sec. In some embodiments, switch 292 can be repetitively opened in a range of 1 sec to 100 sec. Closing and opening switch 292 allows a multilayered film to be formed in which layers have different microstructures. In some embodiments, layers (1) and layers (2) have different concentrations of sp3 bonds as shown in FIG. 7 (b). The substrate support 284 can include a heater that is connected to a temperature controller. The temperature controller regulates the temperature of the substrate 283. In an embodiment, the temperature controller controls the temperature of the substrate 283 to be in a range of −20 C to (+1200) C.

An additional magnet assembly between LT-HDP-CVD source 200 and substrate 283 can be positioned inside the chamber 270 or outside the chamber 270 in order to increase plasma density near the substrate and, therefore, increase the dissociation rate of the gas molecules and improve film uniformity on the substrate. Power supplies 207, 210, 233, 286, 290 can be connected to the controller 214 and computer 215.

Figure 8:
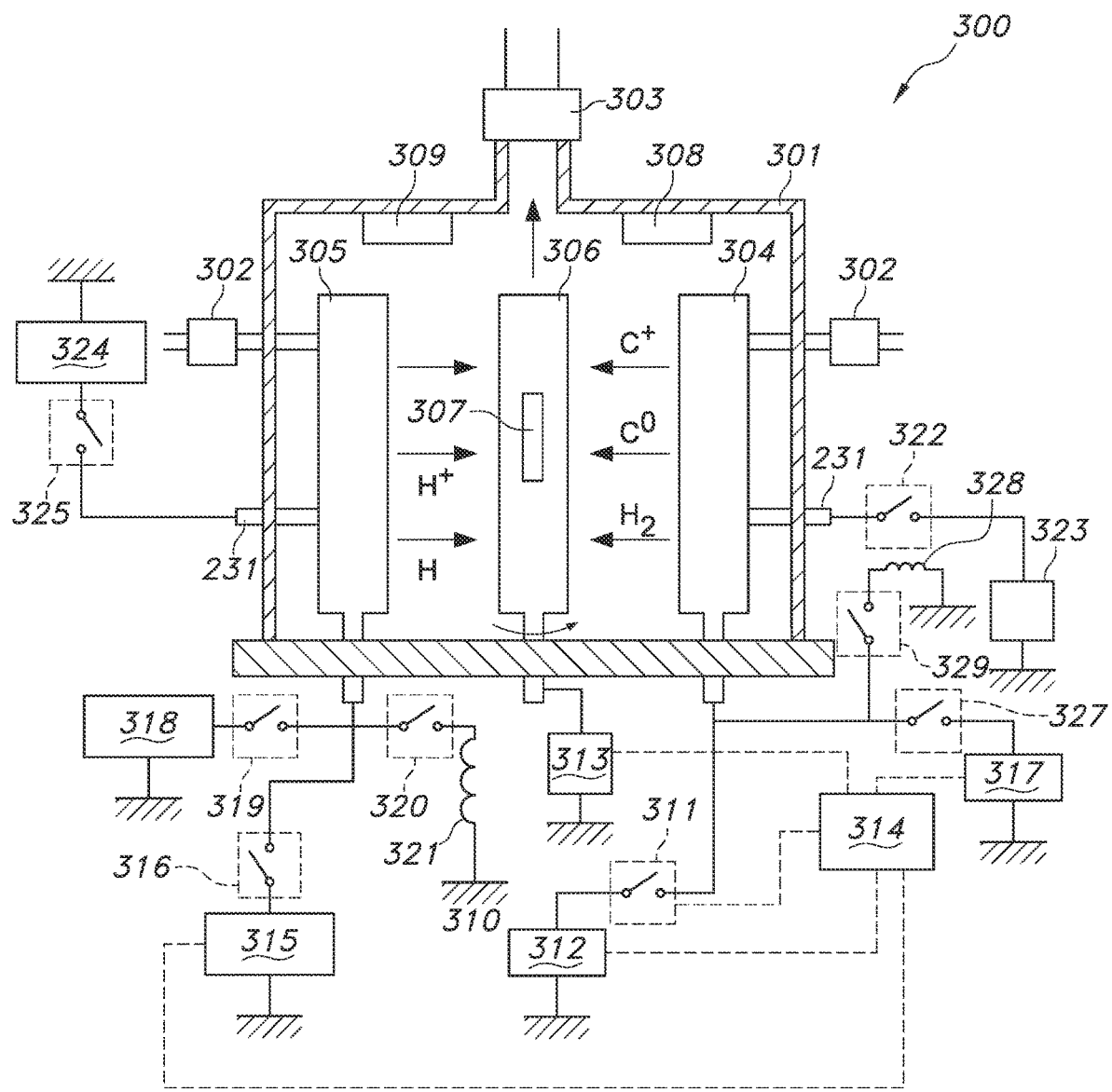
FIG. 8 shows an illustrative cross-sectional view of an embodiment of a magnetically enhanced LT-HDP-CVD system having two rectangular LT-HDP-CVD sources.

The magnetically enhanced LT-HDP-CVD source can be positioned in the vacuum chamber 301 as shown in FIG. 8. Two rectangular magnetically enhanced LT-HDP-CVD sources 304 and 305 are positioned inside the vacuum chamber 301. Vacuum pump 302 can provide a base pressure up to $10^{-8}$ Torr. Two heaters 308, 309 control temperature of the substrate 307. Two rectangular magnetically enhanced LT-HDP-CVD sources 304, 305 are connected to power supplies 318, 316 and 317, 312 respectively. LT-HDP-CVD source 305 is connected to RF power supply 318 through switch 319 and connected to ground through inductor 321 and switch 320. LT-HDP-CVD source 305 is connected to pulse power supply 315 through switch 316. Pole piece 223 from LT-HDP-CVD source 305 is connected to power supply 324 through switch 325 and electrode 231. LT-HDP-CVD source 304 is connected to RF power supply 317 through switch 327 and is connected to ground through inductor 328 and switch 329. LT-HDP-CVD source 304 is connected to pulse power supply 312 through the switch 311. The pole piece 223 from LT-HDP-CVD source 304 is connected to power supply 323 through switch 322 electrode 231. Substrate holder 306 is connected to bias power supply 313. Power supplies 313, 318, 324, 315, 312, 317, 323 and switches 325, 319, 316, 320, 311, 322, 329, 327 are connected to controller 314. Power supplies 315, 312 can provide any voltage pulses in any order as shown in FIG. 4 (a, b, c, d), FIG. 5 (a, b, c, d), and FIG. 6 (a, b). Power supplies 318, 317 can provide RF voltage as shown in FIGS. 4 (a, b, c, d), FIG. 5 (a, b, c, d), and FIG. 6 (a, b). Bias power supply 313 can be an RF power supply with a frequency in a range of 500 kHz to 30 MHz. Bias power supply 313 can be a DC power supply or pulse DC power supply. Power supplies 318, 315, 312, 313, 317, 324, 323 can be connected to controller 314.

The substrate support 306 can provide for rotation of the substrate 307. The substrate support 306 can have different parts that rotate at different speeds. The substrate support 306 can hold one or more substrates 307 or work pieces.

In an embodiment, the substrate 307 is a part of an automobile engine and the coating is a hydrogenated diamond-like coating (DLC). In an embodiment, the substrate 307 is a part of an automobile engine and the coating is hydrogenated diamond-like coating (DLC). The DLC coating reduces a coefficient of friction of moving parts in the automobile engine. The thickness of the DLC coating is in a range of 0.1 to 10 mkm depending on the particular engine part. The parts that can be coated include the turbocharger, valve, piston, piston ring, piston pin, heat exchanger, connecting rod, crank end bearing, bearing, ball from any bearing, after cooler, intercooler, rocker arm, injector, valve guide, push rod, camshaft, fuel injection pump, oil pump, or any other part associated with the automobile engine.

The method of LT-HDP-CVD depositing film on the substrate includes the following steps. A first step is cleaning the surface of the substrate by a sputter etch process with a noble gas. In this step, the feed gas will be a noble gas, such as Ar. The gas pressure can be in a range of 1 to 20 mTorr. The substrate bias can be between −300 V and −1000 V. Magnetically enhanced CVD sources 305 operate in sputter etch mode. In this mode, only RF power supplies 318 and 317 are connected to the cathode from LT-HDP-CVD source 305 and/or 304. The cathodes of the LT-HDP-CVD sources 305, 304 are inductively grounded in order to prevent sputtering from the cathode. RF power supplies generate RF power in a range of 1 to 10 kW. In some embodiments, cathodes from LT-HDP-CVD sources are only connected to pulse power supplies 315, 312. Power supplies 315, 312 generate voltage pulses with amplitude, duration, and frequency selected to provide optimum energy in a range of 150 eV to the electrons to generate Ar ions.

A second step is reactive ion etch (RIE) cleaning of the surface of the substrate using a reactive gas, such as $O_2$ or $H_2$. In some embodiments, the cleaning is made with $H_2$. The gas pressure can be in the range of 1 mTorr to 100 mTorr. The substrate bias can be between −100 V and −1000 V. Magnetically enhanced LT-HDP-CVD sources 305 and 304 are operated in RIE mode. In this mode, only RF power supplies 318 and/or 317 are connected to LT-HDP-CVD source 305 and/or 304. The cathode from LT-HDP-CVD source 305 is inductively grounded. Power supply 312 generates RF discharge. Power supply 324 generates voltage pulses with an amplitude, duration, and frequency selected to provide optimum energy in the range of 150 eV to the electrons to generate reactive gas ions. The voltage pulse duration can be in the range of 3-50 μs. For example, the amplitude of the voltage oscillations can be in the range of 300 to 1000 V in order to increase the ionization rate of gas atoms. The voltage pulse duration can be in the range of 3-8 microseconds. In an embodiment, only the RF power supply 312 operates and the RF power level is optimized by adjusting output power to provide an optimum amount of energy for the electrons in order to maximize the probability of generating atomic hydrogen when electrons collide with hydrogen molecules. In an embodiment, power supplies 312, 317 operate simultaneously to generate atomic hydrogen. The third step is film deposition. In this step, any gas that includes carbon atoms, such as acetylene, methane, and the like can be used. The substrate temperature is in the range of about 400 C.

In an embodiment, the work piece is a part of a jet engine, and the coating can be hydrogenated DLC or hydrogenated metal-doped DLC.

Figure 9:
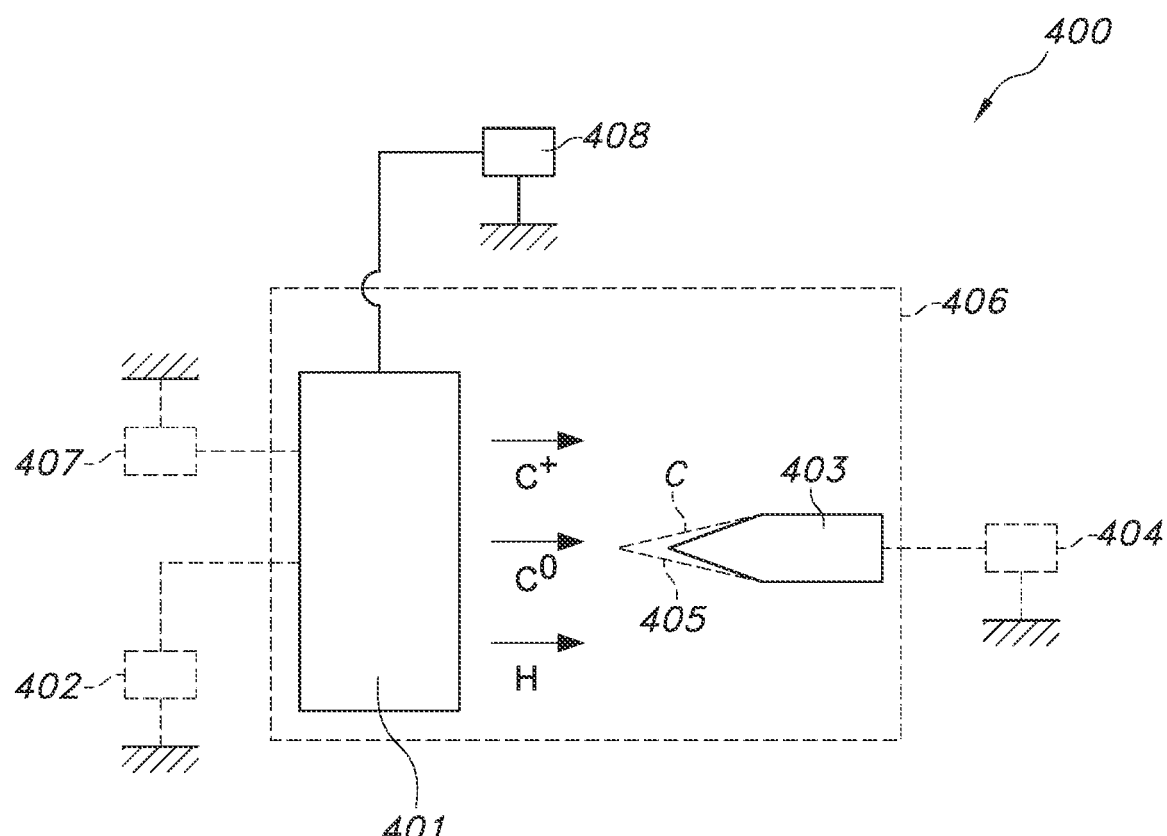
FIG. 9 shows an illustrative cross-sectional view of an embodiment of a magnetically enhanced LT-HDP-CVD source and processes for applying a coating on a razor blade tip.

In an embodiment, the magnetically enhanced LT-HDP-CVD source can be used to form hard DLC coating on the tip of a razor blade, as shown in FIG. 9. A blade 403 and magnetically enhanced LT-HDP-CVD source 401 are positioned inside a vacuum chamber 406. A feed gas, such as Ar, $C_2H_2$, $CH_4$, or any other gas that contains carbon atoms, is used for the LT-HDP-CVD process. Power supply 402 provides negative voltage pulses to the cathode 203 from LT-HDP-CVD, as shown in FIG. 2 and FIG. 9, with a specified voltage amplitude, pulse duration and frequency. The parameters of the voltage pulses are shown in FIG. 4(a, b, c, d), FIG. 5 (a, b, c, d), FIG. 6 (a, b, c, d). Power supply 404 provides a negative bias voltage on the blade in the range of −20 V to (−200V). Power supply 408 is connected to the pole piece 223 as shown in FIG. 2 and FIG. 9. Power supply 408 provides voltage pulses to increase electron energy and increase ionization degree of carbon atoms. Power supply 407 generates RF power and is connected to the cathode 203 from LT-HDP-CVD as shown in FIG. 2 and FIG. 9. In some embodiments, only power supply 402 is connected to the cathode 203. The voltage pulse shapes and voltage pulse frequency from power supply 402 are optimized in order to obtain a DLC film with hardness in the range of 20-30 GPa. In some embodiments, only power supply 407 is connected to the cathode 203. The RF power from power supply 407 is optimized in order to obtain a DLC film with hardness in the range of 30-40 GPa.

The magnetically enhanced LT-HDP-CVD source can be used for many different applications. The deposition of diamond and DLC coatings with a CVD source include, but are not limited to, smart phones, tablets, flat panel displays, hard drives, read/write heads, hair removal, optical filters, watches, valves, facets, thin film batteries, disks, microelectronics, hard masks, transistors, manufacturing mono and poly crystal substrates, and the like. The magnetically enhanced LT-HDP-CVD plasma source can be configured for sputtering applications.

Figure 10:
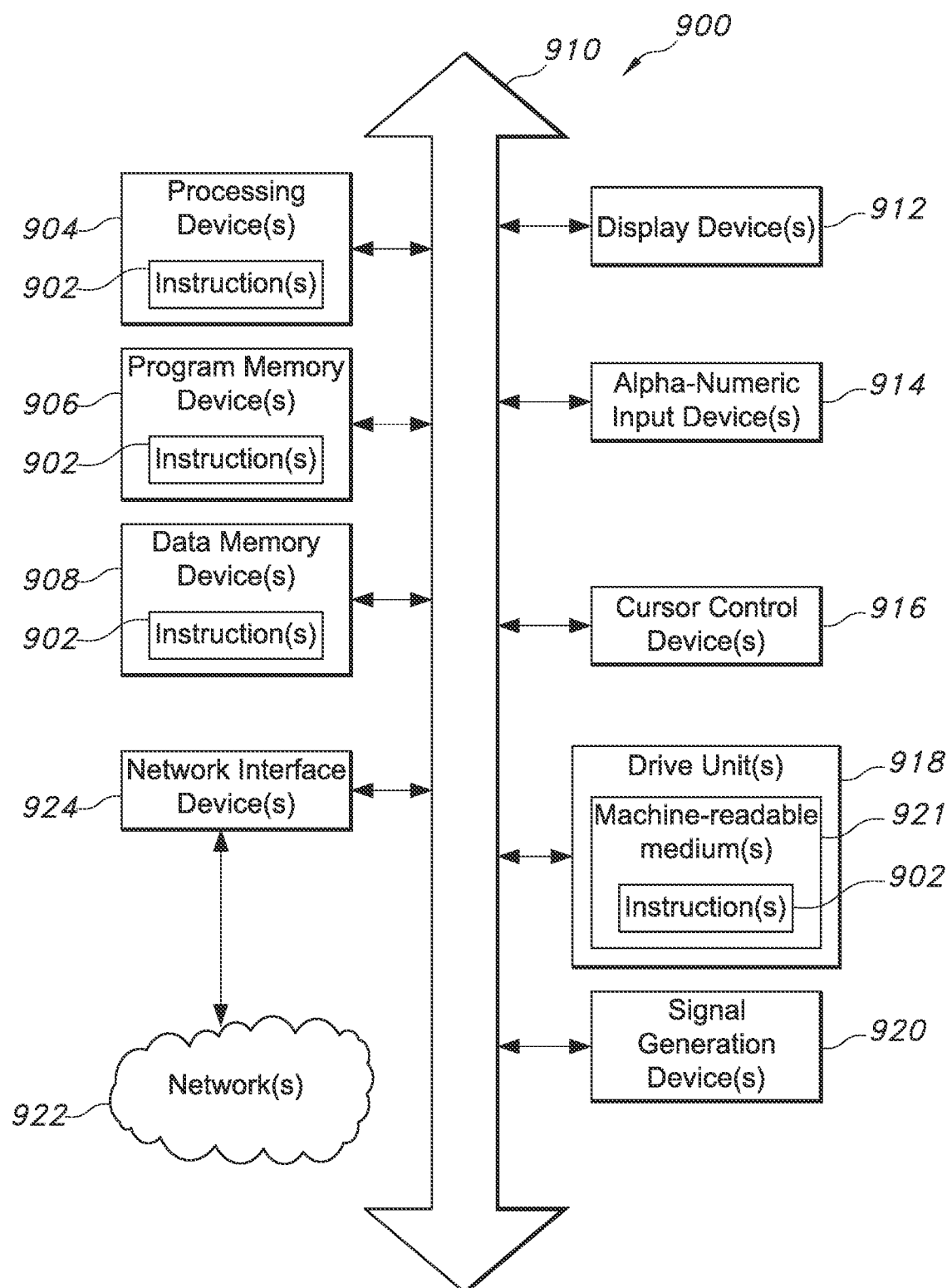
FIG. 10 shows a block diagram of at least a portion of an exemplary machine in the form of a computing system that performs methods according to one or more embodiments disclosed herein.

One or more embodiments disclosed herein, or a portion thereof, may make use of software running on a computer or workstation. By way of example, only and without limitation, FIG. 10 is a block diagram of an embodiment of a machine in the form of a computing system 900, within which is a set of instructions 902 that, when executed, cause the machine to perform any one or more of the methodologies according to embodiments of the invention. In one or more embodiments, the machine operates as a standalone device; in one or more other embodiments, the machine is connected (e.g., via a network 922) to other machines. In a networked implementation, the machine operates in the capacity of a server or a client user machine in a server-client user network environment. Exemplary implementations of the machine as contemplated by embodiments of the invention include, but are not limited to, a server computer, client user computer, personal computer (PC), tablet PC, personal digital assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 900 includes a processing device(s) 904 (e.g., a central processing unit (CPU), a graphics processing unit (GPU), or both), program memory device(s) 906, and data memory device(s) 908, which communicate with each other via a bus 910. The computing system 900 further includes display device(s) 912 (e.g., liquid crystal display (LCD), flat panel, solid state display, or cathode ray tube (CRT)). The computing system 900 includes input device(s) 914 (e.g., a keyboard), cursor control device(s) 916 (e.g., a mouse), disk drive unit(s) 918, signal generation device(s) 920 (e.g., a speaker or remote control), and network interface device(s) 924, operatively coupled together, and/or with other functional blocks, via bus 910.

The disk drive unit(s) 918 includes machine-readable medium(s) 926, on which is stored one or more sets of instructions 902 (e.g., software) embodying any one or more of the methodologies or functions herein, including those methods illustrated herein. The instructions 902 may also reside, completely or at least partially, within the program memory device(s) 906, the data memory device(s) 908, and/or the processing device(s) 904 during execution thereof by the computing system 900. The program memory device(s) 906 and the processing device(s) 904 also constitute machine-readable media. Dedicated hardware implementations, such as but not limited to ASICs, programmable logic arrays, and other hardware devices can likewise be constructed to implement methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an ASIC. Thus, the example system is applicable to software, firmware, and/or hardware implementations.

The term "processing device" as used herein is intended to include any processor, such as, for example, one that includes a CPU (central processing unit) and/or other forms of processing circuitry. Further, the term "processing device" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the display device(s) 912, input device(s) 914, cursor control device(s) 916, signal generation device(s) 920, etc., can be collectively referred to as an "input/output interface," and is intended to include one or more mechanisms for inputting data to the processing device(s) 904, and one or more mechanisms for providing results associated with the processing device(s). Input/output or I/O devices (including but not limited to keyboards (e.g., alpha-numeric input device(s) 914, display device(s) 912, and the like) can be coupled to the system either directly (such as via bus 910) or through intervening input/output controllers (omitted for clarity).

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits or method illustrated in the accompanying figures, or portions thereof, may be part of an integrated circuit. Integrated circuits so manufactured are considered part of this invention.

An integrated circuit in accordance with the embodiments of the present invention can be employed in essentially any application and/or electronic system in which buffers are utilized. Suitable systems for implementing one or more embodiments of the invention include, but are not limited to, personal computers, interface devices (e.g., interface networks, high-speed memory interfaces (e.g., DDR3, DDR4), etc.), data storage systems (e.g., RAID system), data servers, etc. Systems incorporating such integrated circuits are considered part of embodiments of the invention. Given the teachings provided herein, one of ordinary skill in the art will be able to contemplate other implementations and applications.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium containing instructions 902, or that which receives and executes instructions 902 from a propagated signal so that a device connected to a network environment 922 can send or receive voice, video or data, and to communicate over the network 922 using the instructions 902. The instructions 902 are further transmitted or received over the network 922 via the network interface device(s) 924. The machine-readable medium also contains a data structure for storing data useful in providing a functional relationship between the data and a machine or computer in an illustrative embodiment of the systems and methods herein.

While the machine-readable medium 902 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memory (e.g., solid-state drive (SSD), flash memory, etc.); read-only memory (ROM), or other non-volatile memory; random access memory (RAM), or other re-writable (volatile) memory; magneto-optical or optical medium, such as a disk or tape; and/or a digital file attachment to e-mail or other self-contained information archive or set of archives is considered a distribution medium equivalent to a tangible storage medium.

Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions and/or logic herein, are optionally stored on a tangible storage medium, such as: a magnetic medium, such as a disk or tape; a magneto-optical or optical medium, such as a disk; or a solid state medium, such as a memory automobile or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

Although the specification describes components and functions implemented in the embodiments with reference to particular standards and protocols, the embodiment are not limited to such standards and protocols.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments are utilized and derived therefrom, such that structural and logical substitutions and changes are made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Such embodiments are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus the following claims are hereby incorporated into the detailed description, with each claim standing on its own as a separate example embodiment.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings provided herein, one of ordinary skill in the art will be able to contemplate other implementations and applications of the techniques of the disclosed embodiments. Although illustrative embodiments have been described herein with reference to the accompanying drawings, it is to be understood that these embodiments are not limited to the disclosed embodiments, and that various other changes and modifications are made therein by one skilled in the art without departing from the scope of the appended claims.

What is claimed is:

1. A magnetically enhanced plasma apparatus comprising:
    a hollow cathode target assembly;
    an anode positioned on top of the hollow cathode target assembly, thereby forming a gap between the anode and the hollow cathode target assembly;
    a cathode magnet assembly;
    a row of magnets that generate a magnetic field in the gap and a magnetic field on a surface of the hollow cathode target assembly with the cathode magnet assembly such that magnetic field lines are substantially perpendicular to a surface of the hollow cathode target assembly;
    an electrode positioned adjacent to the row of magnets behind the gap;
    a first radio frequency (RF) power supply coupled to the electrode, the electrode being coupled to ground through an inductor; and
    a second radio frequency (RF) power supply coupled to the hollow cathode target assembly, the second RF power supply igniting and sustaining plasma in the hollow cathode target assembly, a frequency and power of the second RF power supply being selected to increase at least one of a degree of dissociation of feed gas molecules, degree of ionization of feed gas atoms, a frequency and power of the first RF power supply being selected to increase a degree of dissociation of feed gas molecules to form a layer from sputtering hollow cathode target material onto a substrate.

2. The apparatus defined by claim 1, wherein the RF power supply generates output voltage with a frequency in a range of about 1 MHz to 100 MHz.

3. The apparatus defined by claim 1, further comprising:
    a substrate holder; and
    an RF substrate bias magnetically enhanced plasma power supply coupled to the substrate holder that generates a bias voltage on the substrate in a range of about −10 V to −2000 V.

4. The apparatus defined by claim 3, further comprising an inductor coupled between the substrate holder and ground.

5. The apparatus defined by claim 1, wherein the magnetic field in the gap is in a range of about 50 G to 5000 G.

6. The apparatus as defined by claim 1, wherein the cathode magnetic assembly is rotatable.

7. The apparatus defined by claim 1, wherein the hollow cathode target assembly comprises at least one of B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, Ba.

8. The apparatus defined by claim 1, wherein the hollow cathode target assembly comprises at least one of B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, Ba in combination with at least one of O, N, F, Cl, H.

9. The apparatus defined by claim 1, wherein the pulse power supply generates voltage pulses with positive and negative portions.

10. The apparatus defined by claim 1, wherein the RF power supply generates output voltage with a frequency in a range of about 1 MHz to 100 MHz.

11. The apparatus defined by claim 1, wherein the RF power supply generates a negative bias voltage on the hollow cathode target assembly.

12. A method of sputtering a layer on a substrate using magnetically enhanced plasma, the method comprising:
    forming a gap between a hollow cathode target assembly and an anode on top of the hollow cathode target assembly;
    generating a magnetic field in the gap such that magnetic field lines are substantially perpendicular to a surface of the hollow cathode target assembly;
    connecting a first radio frequency (RF) power supply to an electrode positioned behind the gap, the electrode being coupled to ground through an inductor;
    connecting a second radio frequency (RF) power supply to the hollow cathode target assembly that ignites and sustains volume discharge in the hollow cathode target assembly; and
    selecting a frequency and power of the first RF power supply to increase a degree of dissociation of feed gas molecules to form the layer from sputtering hollow cathode target material onto the substrate.

13. The method defined by claim 12, further comprising connecting an inductor between a pole piece and ground.

14. The method defined by claim 12, further comprising generating bias voltage on the substrate in a range of about −10 V to −2000 V.

15. The method defined by claim 12, wherein the magnetic field in the gap is in a range of about 50 G to 10000 G.

16. The method defined by claim 12, wherein the hollow cathode target assembly comprises at least one of B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, Ba.

17. The method defined by claim 12, wherein the hollow cathode target assembly comprises at least one of B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, Ba in combination with at least one of O, N, F, Cl, H.

18. The method defined by claim 12, wherein the pulse power supply generates voltage pulses with positive and negative portions.

19. The method defined by claim 12, wherein at least one of the first and second RF power supplies generates output voltage with a frequency in a range of about 1 MHz to 100 MHz.

20. The method defined by claim 12, wherein at least one of the first and second RF power supplies generates a negative bias voltage on the hollow cathode target assembly.

* * * * *